(12) United States Patent
Nelson et al.

(10) Patent No.: US 12,062,534 B2
(45) Date of Patent: Aug. 13, 2024

(54) PROCESSED INORGANIC WAFER AND PROCESSING WAFER STACK WITH ABRASIVE PROCESS

(71) Applicant: MOSAIC MICROSYSTEMS LLC, Rochester, NY (US)

(72) Inventors: Shelby Forrester Nelson, Pittsford, NY (US); David Howard Levy, Rochester, NY (US)

(73) Assignee: MOSAIC MICROSYSTEMS LLC, Rochester, NY (US)

( * ) Notice: Subject to any disclaimer, the term of this patent is extended or adjusted under 35 U.S.C. 154(b) by 302 days.

(21) Appl. No.: 17/724,068

(22) Filed: Apr. 19, 2022

(65) Prior Publication Data

US 2022/0246421 A1     Aug. 4, 2022

Related U.S. Application Data

(63) Continuation of application No. PCT/US2020/059407, filed on Nov. 6, 2020.
(Continued)

(51) Int. Cl.
*H01L 21/02* (2006.01)
*H01L 21/683* (2006.01)

(52) U.S. Cl.
CPC .... *H01L 21/02013* (2013.01); *H01L 21/6836* (2013.01)

(58) Field of Classification Search
CPC .......... H01L 21/02013; H01L 21/6836; H01L 21/02024; H01L 21/2633;
(Continued)

(56) References Cited

U.S. PATENT DOCUMENTS

| 5,763,903 A | 6/1998 | Mandai |
| 10,134,657 B2 | 11/2018 | Levesque, Jr. |

(Continued)

FOREIGN PATENT DOCUMENTS

WO    2018217696 A2    11/2018

OTHER PUBLICATIONS

International Search Report issued in Intl. Appln. No. PCT/US2020/059387 mailed Feb. 4, 2021.
(Continued)

*Primary Examiner* — Steven H Loke
*Assistant Examiner* — Anthony A Pulatov
(74) *Attorney, Agent, or Firm* — ROSSI, KIMMS & McDOWELL LLP

(57) ABSTRACT

Processed inorganic wafers and processing a wafer stack including an abrasive process are disclosed. A wafer stack may be formed at least by performing a temporary bonding process to temporarily bond at least a first inorganic wafer to a first surface of a handle wafer. The handle wafer may include at least one inorganic wafer, and the temporary bonding process may include formation of an adhesion layer between the first inorganic wafer and the first surface of the handle wafer. The adhesion layer may include a vacuum deposited carbonaceous film with a thickness between 1 nm and 100 nm, inclusive. An abrasive process may be applied to at least part of the wafer stack, and the abrasive process may reduce a thickness of the first inorganic wafer of the wafer stack. The first inorganic wafer may be debonded from the handle wafer after applying the abrasive process.

21 Claims, 25 Drawing Sheets

Related U.S. Application Data

(60) Provisional application No. 62/932,543, filed on Nov. 8, 2019.

(58) Field of Classification Search
CPC .. H01L 21/304–3046; H01L 21/32131–32132; H01L 21/463; H01L 21/4842; H01L 21/4878; H01L 21/4896; H01L 21/02021; H01L 21/30625; H01L 21/31051; H01L 21/7684; H01L 21/02002–02035; H01L 2224/1319–13191; H01L 2224/1369–13691; H01L 2224/2919–29191; H01L 2224/2969–29691; H01L 2224/8185–8189; H01L 2224/8385–93995; B24B 1/00; B24B 49/04; B24B 49/065; B24B 7/228; B24B 9/065

See application file for complete search history.

(56) References Cited

U.S. PATENT DOCUMENTS

| | | |
|---|---|---|
| 2012/0045611 A1 | 2/2012 | Shih |
| 2012/0315739 A1 | 12/2012 | Hashii |
| 2013/0034687 A1 | 2/2013 | Koike et al. |
| 2013/0037922 A1 | 2/2013 | Arriagada et al. |
| 2013/0075739 A1 | 3/2013 | Loy |
| 2015/0060402 A1 | 3/2015 | Burkett |
| 2016/0069379 A1 | 3/2016 | Bae |
| 2017/0036419 A1 | 2/2017 | Adib |
| 2018/0005922 A1 | 1/2018 | Levesque, Jr. |
| 2018/0047630 A1* | 2/2018 | Kato ............... H01L 21/02002 |
| 2018/0294209 A1* | 10/2018 | Yoon ............... H01L 21/02118 |
| 2018/0342450 A1 | 11/2018 | Huang et al. |
| 2018/0342451 A1 | 11/2018 | Dahlberg |
| 2019/0109034 A1 | 4/2019 | Fehkuhrer |
| 2019/0185373 A1 | 6/2019 | Hu |
| 2019/0312067 A1 | 10/2019 | Garner et al. |
| 2020/0354267 A1 | 11/2020 | Cai et al. |

OTHER PUBLICATIONS

Written Opinion issued in Intl. Appln. No. PCT/US2020/059387 mailed Feb. 4, 2021.

Copending U.S. Appl. No. 17/723,701, filed Apr. 19, 2022 (a copy is not included because the cited application is not yet available to the public and the Examiner has ready access to the cited application).

Levy. Copending U.S. Appl. No. 18/383,231, filed Oct. 24, 2023 (a copy is not included because the cited application is not yet available to the public and the Examiner has ready access to the cited application).

Extended European Search Report issued in European Appln. No. 20884706.1, mailed Nov. 8, 2023.

Ostholt. "High speed through glass via manufacturing technology for interposer." Proceedings of the 5th Electronics System-integration Technology Conference (ESTC). IEEE, 2014. Cited in specification.

Gillis. "Double-Cantilever Cleavage Mode of Crack Propagation", Journal of Applied Physics. 1964: 647-658. vol. 35, No. 3. Cited in Specification.

International Search Report issued in Intl. Appln. No. PCT/US2020/059407 mailed Mar. 18, 2021.

Written Opinion issued in Intl. Appln. No. PCT/US2020/059407 mailed Mar. 18, 2021.

International Preliminary Report on Patentability issued in Intl. Appln. No. PCT/US2020/059407 mailed Nov. 4, 2021.

International Search Report issued in Intl. Appln. No. PCT/US2022/025924 mailed Jul. 28, 2022.

Written Opinion issued in Intl. Appln. No. PCT/US2022/025924 mailed Jul. 28, 2022.

"Borosilicate glass", Wikipedia. 2012, Retrieved from the Internet on Jun. 17, 2022. < https://en.wikipedia.org/wiki/Borosilicate_glass>.

International Preliminary Report on Patentability issued in Intl. Appln. No. PCT/US2022/025924 mailed Aug. 31, 2023.

\* cited by examiner

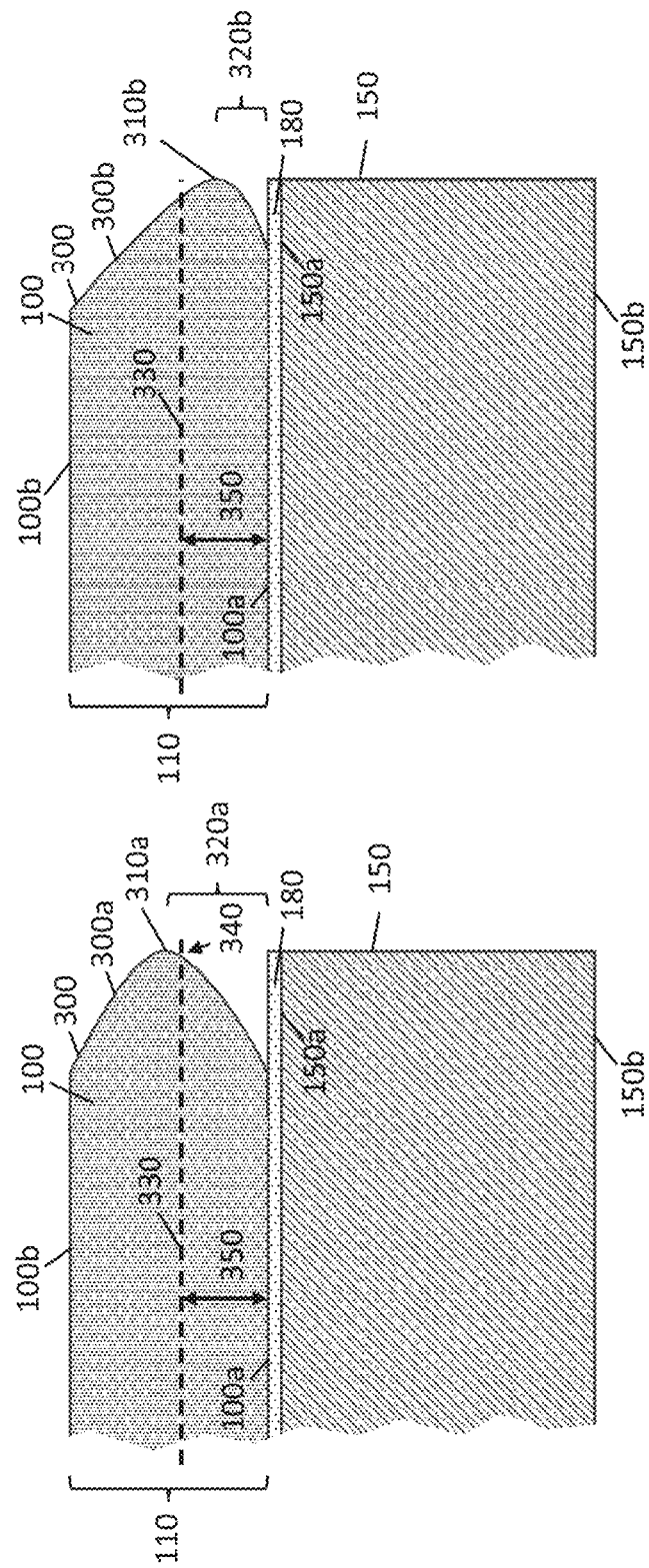

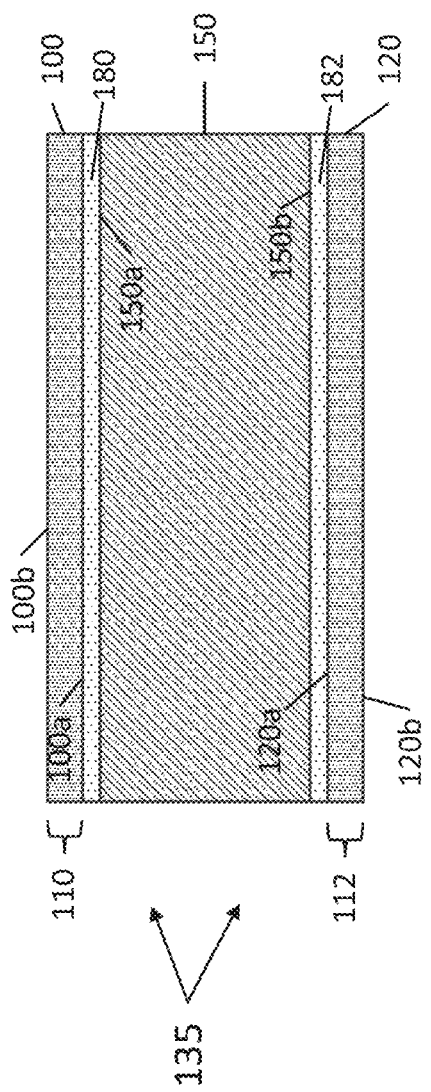

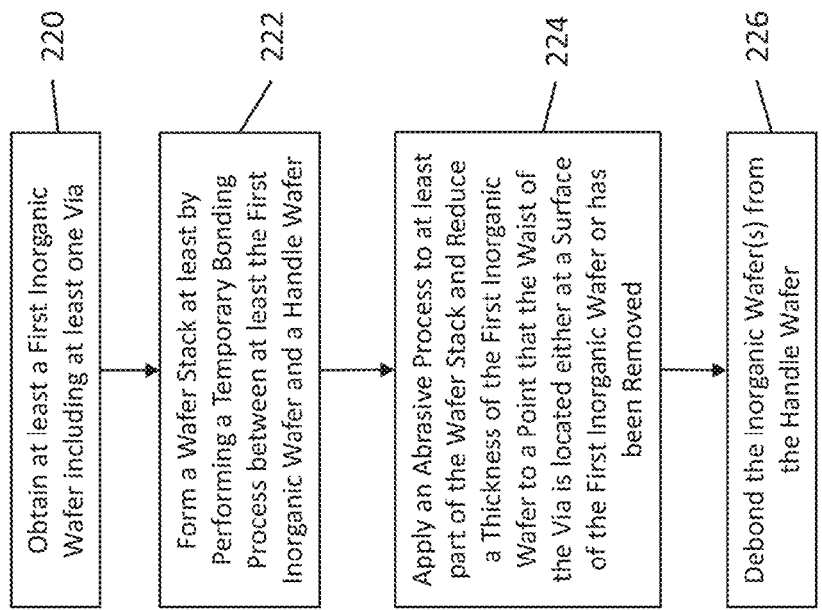

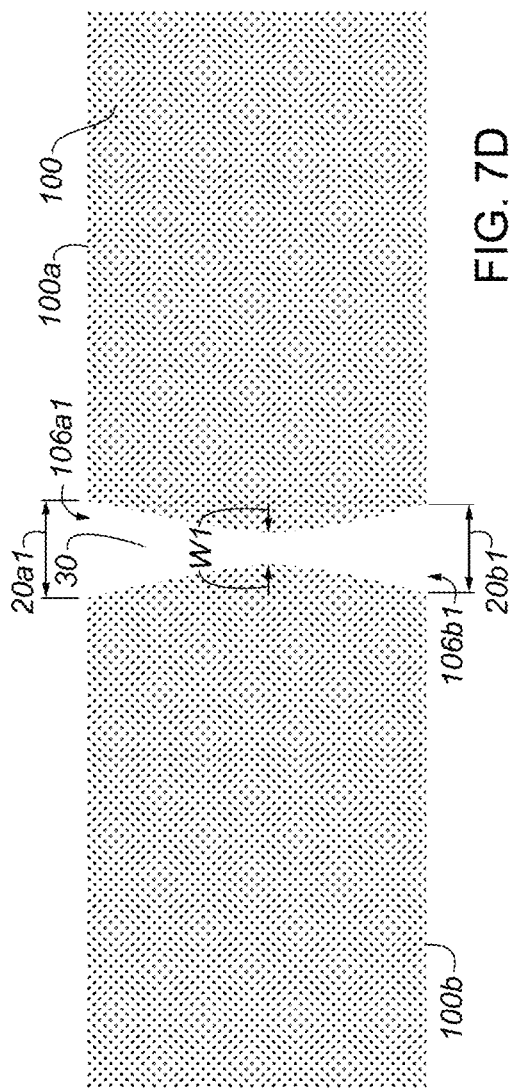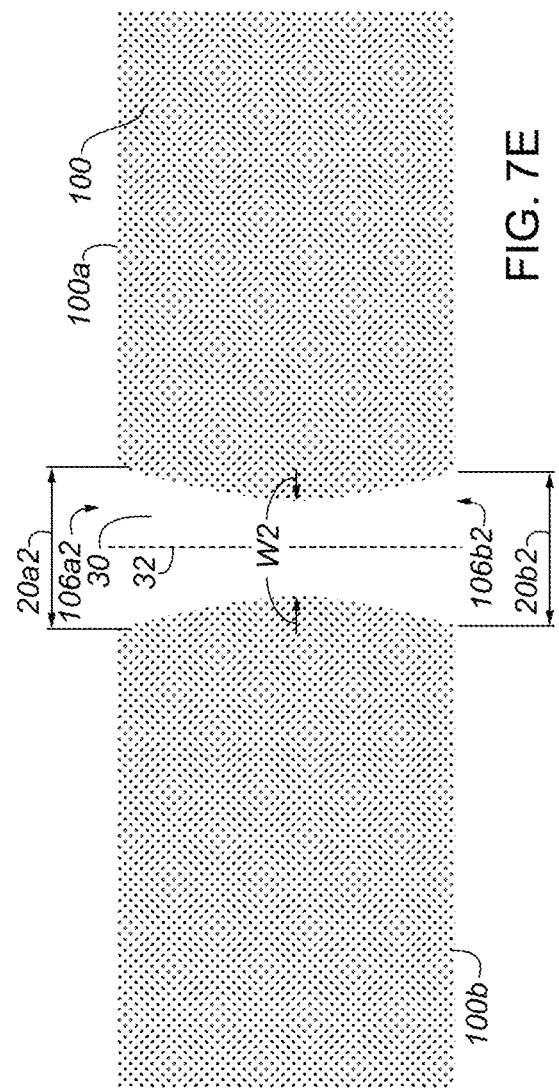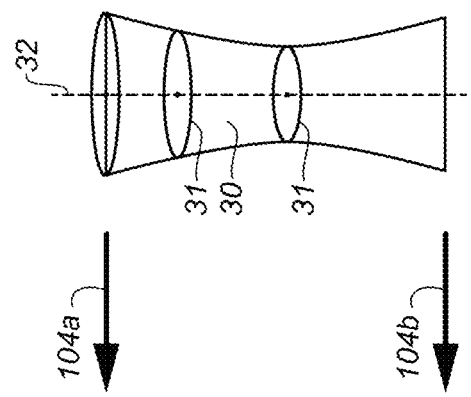

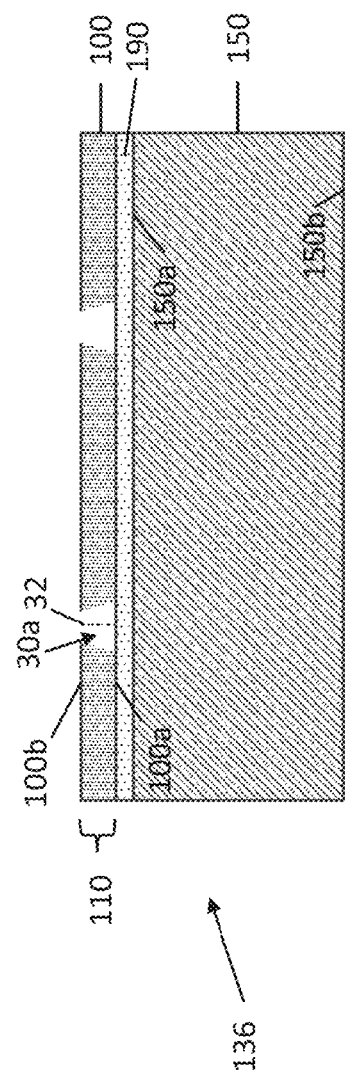

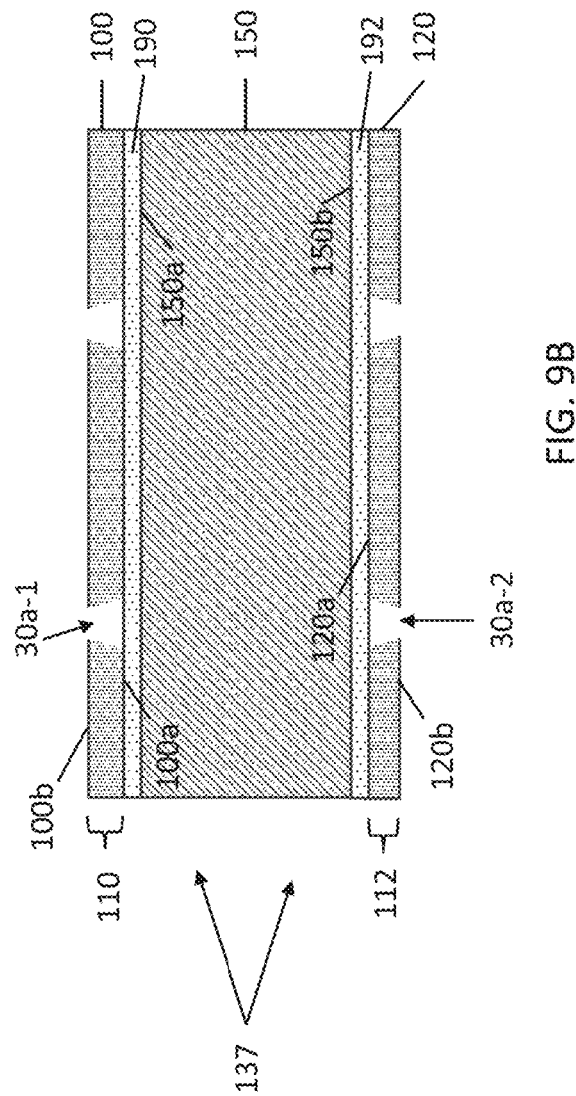

PROCESSED INORGANIC WAFER AND PROCESSING WAFER STACK WITH ABRASIVE PROCESS

CROSS-REFERENCE TO RELATED APPLICATIONS

This application is a Bypass Continuation application of International Application No. PCT/US2020/059407, filed Nov. 6, 2020, which claims the benefit of U.S. Provisional Application No. 62/932,543, filed Nov. 8, 2019, the entire disclosure of each of these applications is hereby incorporated herein by reference.

TECHNICAL FIELD

Aspects of this disclosure generally are related at least to one or more processed inorganic substrates and processing one or more inorganic substrates, including, according to some embodiments, applying an abrasive process to a substrate stack and debonding an inorganic substrate from the substrate stack after the abrasive process to form a processed inorganic substrate.

BACKGROUND

Thin inorganic substrates, such as glass, are valuable for advanced electronics and photonics applications, including packaging, as well as for a variety of optics and MEMs applications. Fused silica, for example, can be formed in boules which can be cut into thin sections, or which can be cut first into desired shapes and then cut into thin sections. The thin sections can then be carefully polished. In this way, fused silica wafers can be formed for use in, for example, semiconductor and optical applications. High purity fused silica, in particular, is valued for its good optical transmission in the ultraviolet spectrum, and for its mechanical properties, such as extreme hardness, resistance to high temperatures, and its low coefficient of thermal expansion. Other inorganic materials can be similarly formed in boules and then shaped into wafers, such as semiconductors like silicon, silicon carbide, and gallium arsenide, and insulators such as sapphire.

Wafers or panels formed by the cutting and polishing process are typically left at a thickness that makes them easy to handle and subsequently process. There are typically both higher costs for thinner material and less commercial availability. For many applications, the thin inorganic substrates must have tight adherence to specifications for low total thickness variation.

For certain applications, the inorganic substrate thickness that is readily available is thicker than desirable. Accordingly, a need in the art exists for improved methods of reducing a thickness of inorganic substrates to produce inorganic substrates of a desirable thinness.

Further, it should be noted that thin inorganic substrates with precisely formed and precisely positioned through-holes, or vias, have many applications in electronic and photonic packaging. In thin inorganic substrates that are insulating, a through-substrate via can be filled with conductive material to provide a vertical electrical connection that passes completely through the substrate. A via may be a hole through the substrate that is large enough to fill with conductive material, in order to conduct electrical signals from one surface of the substrate to the other. An example of an insulating inorganic substrate is glass, and one type of glass is high purity fused silica. High purity fused silica is valued for its good optical transmission in the ultraviolet spectrum, and for its mechanical properties, such as extreme hardness, resistance to high temperatures, and its low coefficient of thermal expansion.

The through-holes to be filled with conductive material can be formed by a variety of methods, including lithography of photolithographic glass, sand-blasting, electric discharge drilling, swift heavy ion tracks, and many versions of laser drilling. In some cases, the holes are formed to the correct opening size directly. In others, the positions of the vias are established by a method which creates a damage track or preformed opening or pilot hole in the glass, while a subsequent wet etching process enlarges the damage track to create a through-hole with the desired diameter.

When processing an inorganic substrate, such as fused silica, the details of the via formation typically have to be carefully designed to create smooth, circular, vias of the correct opening diameter with low cracking around the holes. Furthermore, speed of sample throughput and capital costs for the manufacturing equipment are important parameters for a manufacturing process. See, Ostholt, Roman, et al. "High speed through glass via manufacturing technology for interposer." Proceedings of the 5th Electronics System-integration Technology Conference (ESTC). IEEE, 2014. Such considerations have directed considerable attention to approaches that involve first the creation of the above-mentioned damage track/pilot hole, and then a subsequent wet-etch to enlarge the hole.

In this regard, FIGS. 12A-12C illustrate a conventional via formation process, where, as shown in FIG. 12A, a single-sided wet-etching process is applied to a first surface $400a$ of a glass or other inorganic substrate $400$ having a damage track $40$ formed therein to create a via $45$ (FIG. 12B). To protect the second surface $400b$ from the wet-etching process, a sealant material layer $450$ is applied to the second surface $400b$.

When substrate $400$ is immersed in etch solution, the etch will begin at the exposed surface $400a$ and progress so that the largest diameter of the via $45$ is at the top first surface $400a$, represented by opening $45a$ of via $45$ in FIG. 12B. Once the via $45$ is etched through to the sealed second surface $400b$, as shown in FIG. 12B, the etching must continue to be applied further to enlarge the opening $45b$ in FIG. 12B on the sealed second surface $400b$ to the desired diameter, $20tb$ shown in FIG. 12C. This added duration of the wet etch means that the top diameter $20ra$ in FIG. 12B also continues to grow to a potentially undesired diameter $20ta$ as shown in FIG. 12C, resulting in a tapered through-hole. In this regard, the present inventors recognized that one potential difficulty of this single-sided wet etching process is that the final diameter of the top opening of the via $45$ in the exposed first surface $400a$ is dependent on the thickness $410$ of the substrate $400$ and the desired diameter of the bottom opening of the via $45$ in the sealed second surface $400b$. Thus, the density of vias in the substrate $400$ is limited by this conventional single-sided wet etching process due to the relatively large size of the via openings (e.g., opening $45a$) in the exposed first surface $400a$ of the substrate $400$, and the achievable size of via $45$ is tied directly to and possibly limited by the thickness $410$ of the substrate $400$.

Another difficulty frequently encountered in this single-sided wet etching process recognized by the present inventors is that wet etching can readily occur along the interface $46$ (FIG. 12C) between the sealant material layer $450$ and the second surface $400b$ of the substrate $400$, once the hole through the substrate $400$ allows the etchant to reach that interface 46. This situation causes lateral etching along the interface 46, causing an undercutting or laterally-etched region 47 (FIG. 12C) that grows with time during the etching. The laterally-etched region 47 can achieve a diameter 59 considerably larger than the diameter 20ta of the opening 45a at the surface 400a. As shown in FIG. 12C, the diameter 20ta of the top opening 45a of the via 45 is much smaller than the diameter 59 of the laterally-etched region 47. The present inventors recognize that the presence of such a large undercut or laterally-etched region 47 is not preferred and can be harmful to performance.

Finally, if the wafer or panel substrate 400 has been thinned below the thickness that makes them easy to handle and process before starting the via-formation process, the wafer or panel substrate is more likely to break during the process of forming a via than if the substrate were thick.

Accordingly, the present inventors recognized that the conventional single sided wet etching process of FIGS. 12A-12C is less preferable due at least to the presence of the large undercutting or laterally-etched region 47 and the relatively large diameter 20ta exhibited by the opening 45a in the exposed first surface 400a of the substrate 400, which limits via density. The present inventors also recognized that a lack of control exists over opening diameter 20ta, which is dependent on the thickness 410 of the substrate 400. The present inventors also recognize the need for secure handling of thin substrates during the via formation process.

Therefore, the present inventors recognized that a need in the art exists for improved via formation in thin inorganic substrates.

SUMMARY

At least the above-discussed needs are addressed and technical solutions are achieved in the art by various embodiments of the present invention. According to some embodiments, a method of processing an inorganic wafer includes forming a wafer stack at least by performing a temporary bonding process to temporarily bond at least a first inorganic wafer to a first surface of a handle wafer. The handle wafer may include at least one inorganic wafer. The temporary bonding process may include formation of an adhesion layer between the first inorganic wafer and the first surface of the handle wafer. The adhesion layer may include a vacuum deposited carbonaceous film with a thickness between 1 nm and 100 nm, inclusive. The method may include applying an abrasive process to at least part of the wafer stack. The abrasive process may reduce a thickness of the first inorganic wafer of the wafer stack. The method may include debonding the first inorganic wafer from the handle wafer after the applying the abrasive process.

In some embodiments, the adhesion layer provides a bond energy between 200 mJ/m2 and 1200 mJ/m2, inclusive.

In some embodiments, the handle wafer includes a second surface on an opposite side of the handle wafer from the first surface of the handle wafer. The forming of the wafer stack may include performing the temporary bonding process to temporarily bond at least (a) the first inorganic wafer to the first surface of the handle wafer, and (b) a second inorganic wafer to the second surface of the handle wafer. The abrasive process may reduce a thickness of the first inorganic wafer of the wafer stack and may reduce a thickness of the second inorganic wafer of the wafer stack. The debonding may include debonding the first inorganic wafer and the second inorganic wafer from the handle wafer. A diameter of the handle wafer may exceed a diameter of each of the first inorganic wafer and the second inorganic wafer by at least 1 mm. A diameter of the handle wafer may be equal to a diameter of each of the first inorganic wafer and the second inorganic wafer. Prior to applying the abrasive process, a thickness of each of the first inorganic wafer and the second inorganic wafer of the wafer stack may be between 300 micrometers and 1 mm, inclusive, and, upon completion of applying the abrasive process, a thickness of each of the first inorganic wafer and the second inorganic wafer of the wafer stack may be between 200 micrometers and 10 micrometers, inclusive.

In some embodiments, the handle wafer includes multiple inorganic wafers bonded to each other, either temporarily bonded or permanently bonded.

In some embodiments, the handle wafer has a thickness in a range of 0.3 mm to 10 mm.

In some embodiments, a diameter of the handle wafer exceeds a diameter of the first inorganic wafer by at least 1 mm.

In some embodiments, a diameter of the handle wafer is equal to a diameter of the first inorganic wafer.

In some embodiments, the handle wafer includes an inorganic wafer made of silicon, fused silica, borosilicate glass, or boro-aluminosilicate glass.

In some embodiments, prior to applying the abrasive process, a thickness of the first inorganic wafer of the wafer stack is between 300 micrometers and 1 mm, inclusive, and, upon completion of applying the abrasive process, a thickness of the first inorganic wafer of the wafer stack is between 200 micrometers and 10 micrometers, inclusive.

In some embodiments, the method includes applying a double-sided opening process to the first inorganic wafer prior to forming the wafer stack. The first inorganic wafer may include a damage track prior to applying the double-sided opening process, and the double-sided opening process may form a via through the first inorganic substrate from the damage track. The abrasive process may reduce a length of the via. The via may have an hourglass shape immediately upon conclusion of the double-sided opening process, and the via may have a conical shape immediately upon conclusion of the abrasive process.

According to some embodiments, a method of forming a tapered via in an inorganic wafer, includes obtaining a first inorganic wafer that includes at least one via through the first inorganic wafer, the via including a waist. The method may include forming a wafer stack at least by performing a temporary bonding process to temporarily bond at least a first surface of the first inorganic wafer to a first surface of a handle wafer. The handle wafer itself may include at least one inorganic wafer. The method may include applying an abrasive process to at least part of the wafer stack. The abrasive process may reduce a thickness of the first inorganic wafer to a point that the waist of the via is located at a second surface of the first inorganic wafer or has been removed. The second surface of the first inorganic wafer may be on an opposite side of the first inorganic wafer than the first surface of the first inorganic wafer, the second surface of the first inorganic wafer existing upon conclusion of the abrasive process. The method may include debonding the first inorganic wafer from the handle wafer after the applying the abrasive process.

In some embodiments, the obtaining the first inorganic wafer includes applying a double-sided opening process to the first inorganic wafer. The first inorganic wafer may include a damage track prior to applying the double-sided opening process. The double-sided opening process may form the via through the first inorganic wafer from the damage track.

In some embodiments, the temporary bonding process includes formation of an adhesion layer between the first surface of the first inorganic wafer and the first surface of the handle wafer. The adhesion layer may include a vacuum deposited carbonaceous film with a thickness between 1 nm and 100 nm, inclusive. The adhesion layer thickness may preferably be between 2 nm and 50 nm, inclusive, in some embodiments.

In some embodiments, the temporary bonding process may include formation of a solution deposited polymeric film between the first surface of the first inorganic wafer and the first surface of the handle wafer. The polymeric film may have a resultant thickness greater than 5 micrometers.

In some embodiments, the handle wafer includes a second surface on an opposite side of the handle wafer from the first surface of the handle wafer. The forming of the wafer stack may include performing the temporary bonding process to temporarily bond at least (a) the first surface of the first inorganic wafer to the first surface of the handle wafer, and (b) a first surface of a second inorganic wafer to the second surface of the handle wafer. The abrasive process may reduce a thickness of the first inorganic wafer of the wafer stack and may reduce a thickness of the second inorganic wafer of the wafer stack. The debonding may include debonding the first inorganic wafer and the second inorganic wafer from the handle wafer.

In some embodiments, the handle wafer is a first handle wafer. After the abrasive process, the method may include forming a second wafer stack at least by performing a second bonding process including bonding the second surface of the first inorganic wafer to a first surface of a second handle wafer. The forming of the second wafer stack may occur before debonding the first inorganic wafer from the first handle wafer. The forming of the second wafer stack may occur after debonding the first inorganic wafer from the first handle wafer.

It should be noted that various embodiments of the present invention include variations of the methods or processes summarized above or otherwise described herein (including the figures) and, accordingly, are not limited to the actions described or shown in the figures or their ordering, and not all actions shown or described are required according to various embodiments. According to various embodiments, such methods may include more or fewer actions and different orderings of actions. Any of the features of all or part of any one or more of the methods or processes summarized above or otherwise described herein (including the figures) may be combined with any of the other features of all or part of any one or more of the methods or processes summarized above or otherwise described herein or shown in the figures.

Various embodiments of the present invention may include apparatuses, systems, devices, or machines that are or include combinations or subsets of any one or more of the apparatuses, systems, devices, or machines and associated features thereof summarized above or otherwise described herein.

BRIEF DESCRIPTION OF THE DRAWINGS

It is to be understood that the attached drawings are for purposes of illustrating aspects of various embodiments and may include elements that are not to scale.

FIGS. 2C and 2D illustrate substrate edges, according to some embodiments of the present invention;

FIGS. 3A-3C illustrate an abrasive or grinding process and a debonding process of two inorganic substrates bonded on opposite sides of a handle wafer, according to some embodiments of the present invention;

FIG. 6 illustrates methods of processing an inorganic wafer including formation of a wafer stack and applying an abrasive process to the wafer stack to produce a via with a waist at one surface or no waist, according to some embodiments of the present invention;

FIGS. 7A-7F illustrate via formation from a damage track including application of a double sided opening process, according to some embodiments of the present invention;

FIGS. 8A-8D illustrate processing of a single inorganic wafer or substrate with a handle wafer, the inorganic wafer including an hourglass via processed to produce a conical or similar via, according to some embodiments of the present invention;

FIGS. 9A-9C illustrate processing of two inorganic wafers or substrates, each including an hourglass via, and the two inorganic wafers bonded on opposite sides of a handle wafer and grinded by way of an abrasive process during the processing to produce a conical or similar via, according to some embodiments of the present invention;

DETAILED DESCRIPTION

At least some embodiments of the present invention provide improved inorganic substrates with or without vias therein, and provide improved methods of thinning an inorganic substrate and improved methods of forming a via in a thin inorganic substrate. In some embodiments of the present invention, an inorganic substrate is temporarily bonded by a very thin carbonaceous layer to a handle wafer, which may be inorganic, and an abrasive process is applied to thin the inorganic substrate in a state in which it is temporarily bonded to the handle wafer. Because the carbonaceous layer is very thin (e.g., between 1 nanometer and 100 nanometers in some embodiments), it avoids introducing a significant wedge or other non-uniformity in the thickness of the wafer stack created by the inorganic substrate on the handle wafer, which can be important, because non-uniformity in the wafer stack thickness can readily translate into non-uniformity in the thinned inorganic substrate. Because the wafer stack is formed with a temporary bond, according to some embodiments, the thinned inorganic substrate can be removed from the handle wafer after the thinning process, leaving an improved inorganic substrate for use in one or more downstream applications.

In order to effectively thin two inorganic substrates simultaneously, in some embodiments of the present invention, an inorganic substrate may be temporarily bonded to each side of the handle wafer, each of the two inorganic substrates bonded to its respective side of the handle wafer with a thin carbonaceous layer for adhesion. Using a double-sided grinding apparatus, an abrasive can be applied to the exposed surface of each inorganic substrate in order to efficiently thin both at once, according to some embodiments. The rates of material removal will not necessarily be identical, but can be characterized in order to achieve the desired final thickness of each inorganic substrate. The thinned inorganic substrates may each be removed from the handle wafer after thinning due to the temporary bonding. The handle wafer may have the same size as the inorganic substrates, or, in some embodiments, the handle wafer may be oversized as compared to one or both of the inorganic substrates.

Figure 12A:
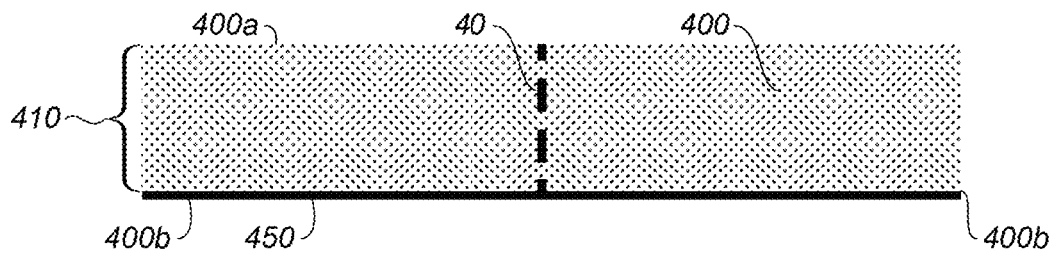
FIGS. 12A-12C illustrate a conventional via formation process.
Figure 12B:
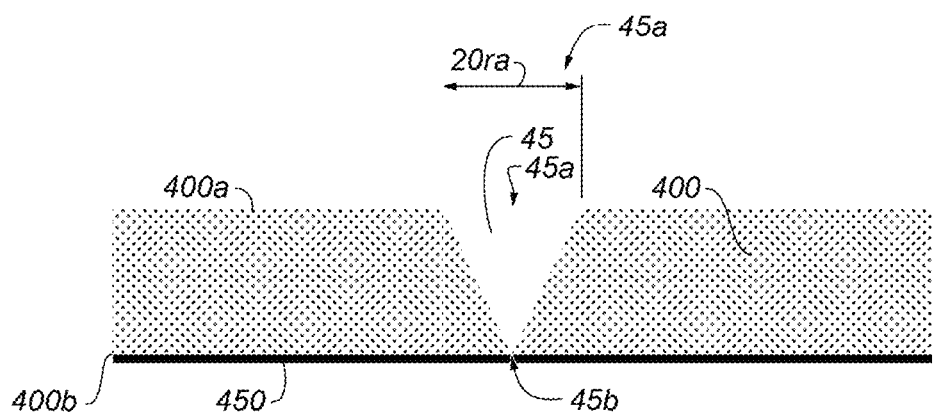
Figure 12C:
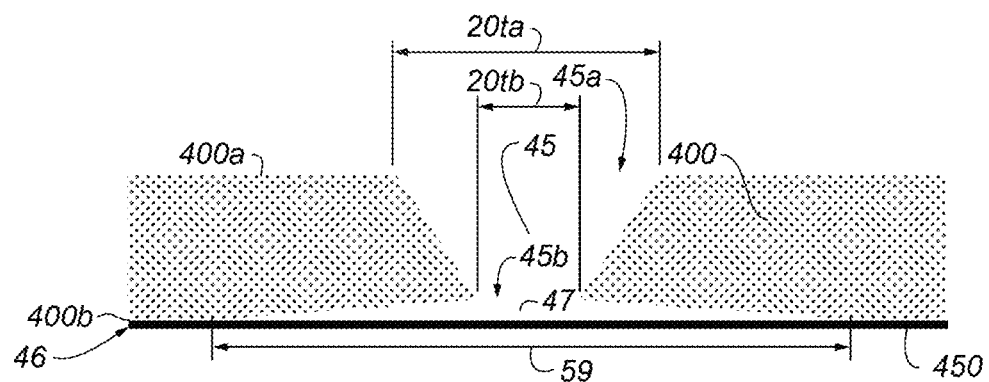

At least some embodiments of the present invention improve upon the above-mentioned conventional process for forming a conical through-substrate via in an inorganic substrate. In some embodiments of the present invention, an inorganic substrate containing at least one hourglass-shaped via is temporarily adhered to a handle wafer, and an abrasive or grinding process is applied to remove, e.g., at least half of the inorganic substrate's thickness. Because of the symmetry of hourglasses, the thinned inorganic substrate at the end of the thinning process contains at least one conical or conical frustum-shaped via, with the small end of the cone or frustum located at the surface of the inorganic substrate furthest away from the handle wafer. Such a via formation process is more efficient than the conventional via formation process discussed above with respect to FIGS. 12A-12C, and can reduce or eliminate the associated undercutting present in such conventional process. In some embodiments, the thinned inorganic substrate is debonded or removed from the handle wafer, leaving an improved inorganic substrate including one or more improved vias for use in one or more downstream applications. In some embodiments, the surface of the thinned inorganic substrate that is furthest from the handle wafer is bonded to a second handle wafer prior to the removal of the thinned inorganic substrate from the first handle, so that the thinned inorganic substrate is supported by at least one handle wafer at all times during the associated processing.

It should be noted that the invention is not limited to the above or any other examples or embodiments provided herein, which are referred to for purposes of illustration only.

In the descriptions herein, certain specific details are set forth in order to provide a thorough understanding of various embodiments of the invention. However, one skilled in the art will understand that the invention may be practiced at a more general level without one or more of these details. In other instances, well-known structures have not been shown or described in detail to avoid unnecessarily obscuring descriptions of various embodiments of the invention.

Any reference throughout this specification to "one embodiment", "an embodiment", "an example embodiment", "an illustrated embodiment", "a particular embodiment", and the like means that a particular feature, structure or characteristic described in connection with the embodiment is included in at least one embodiment. Thus, any appearance of the phrase "in one embodiment", "in an embodiment", "in an example embodiment", "in this illustrated embodiment", "in this particular embodiment", or the like in this specification is not necessarily all referring to one embodiment or a same embodiment. Furthermore, the particular features, structures or characteristics of different embodiments may be combined in any suitable manner to form one or more other embodiments.

Unless otherwise explicitly noted or required by context, the word "or" is used in this disclosure in a non-exclusive sense. In addition, unless otherwise explicitly noted or required by context, the word "set" is intended to mean one or more. For example, the phrase, "a set of objects" means one or more of the objects.

Further, the phrase "at least" is or may be used herein at times merely to emphasize the possibility that other elements may exist besides those explicitly listed. However, unless otherwise explicitly noted (such as by the use of the term "only") or required by context, non-usage herein of the phrase "at least" nonetheless includes the possibility that other elements may exist besides those explicitly listed. For example, the phrase, 'based at least on A' includes A as well as the possibility of one or more other additional elements besides A. In the same manner, the phrase, 'based on A' includes A, as well as the possibility of one or more other additional elements besides A. However, the phrase, 'based only on A' includes only A. Similarly, the phrase 'configured at least to A' includes a configuration to perform A, as well as the possibility of one or more other additional actions besides A. In the same manner, the phrase 'configured to A' includes a configuration to perform A, as well as the possibility of one or more other additional actions besides A. However, the phrase, 'configured only to A' means a configuration to perform only A.

Further, the phrase "in response to" may be used in this disclosure. For example, this phrase may be used in the following context, where an event A occurs in response to the occurrence of an event B. In this regard, such phrase includes, for example, that at least the occurrence of the event B causes or triggers the event A.

The phrases "inorganic wafer", "inorganic panel", "inorganic wafer substrate", and "inorganic panel substrate", may be used interchangeably.

Figure 1:
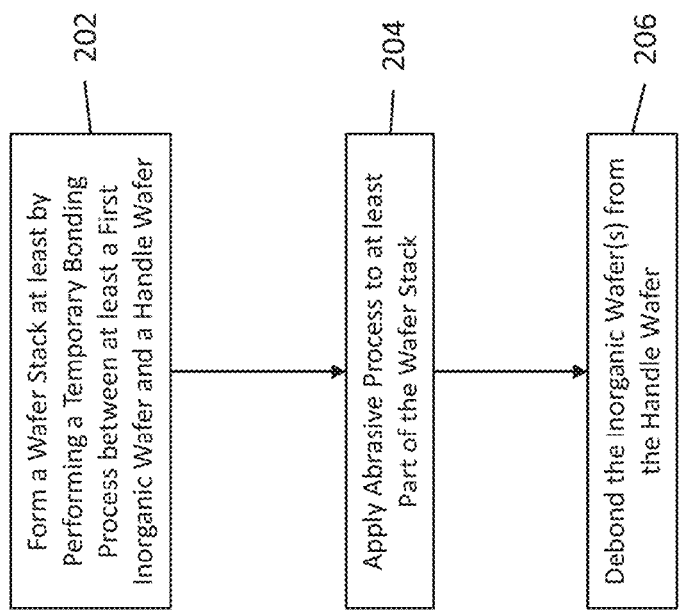
FIG. 1 illustrates methods of processing a wafer stack, including application of an abrasive process to at least part of the wafer stack, according to some embodiments of the present invention.

FIG. 1 illustrates methods of processing an inorganic wafer or substrate, according to some embodiments of the present invention. Although FIG. 1 includes three blocks: block 202, block 204, and block 206 in an illustrated sequence, each block corresponding to respective actions, various embodiments of the present invention include a subset (one or more) of such blocks in same or different sequences (when more than two blocks are included). It should be noted that each block in FIG. 1 may be considered a method step, according to some embodiments. Further, various embodiments of the present invention are not limited to one, or more, or all of the actions shown in the blocks of FIG. 1, and some embodiments of the present invention include other actions described herein not shown in FIG. 1 in addition to or in lieu of the actions shown in FIG. 1. In this regard, FIG. 1 is provided merely for illustration purposes and is not limiting.

Referring to the process flow chart in FIG. 1, block 202 may include obtaining at least one inorganic substrate and a handle wafer or substrate, and performing a temporary bond of the at least one inorganic substrate to the handle wafer or substrate using an adhesion layer comprising a carbonaceous film, to form a wafer stack.

Figure 2A:
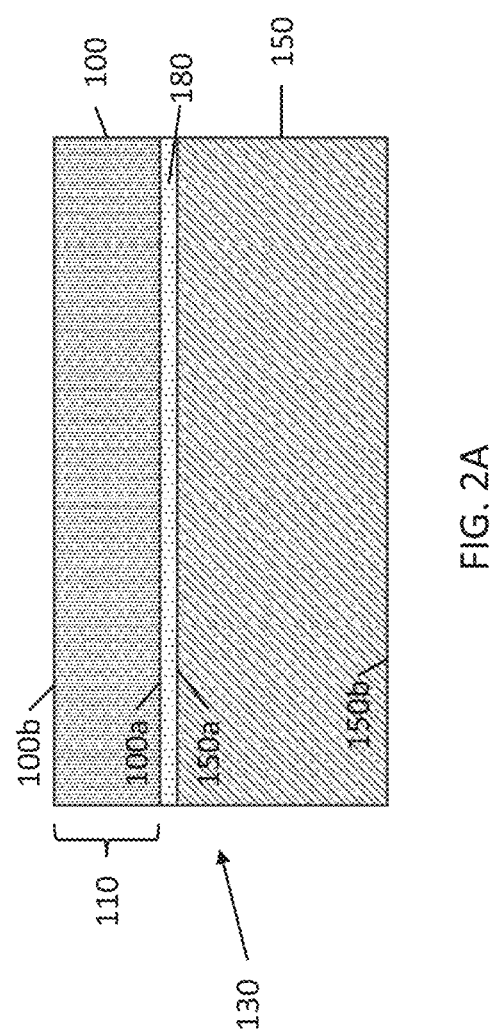
FIGS. 2A, 2B, and 2E illustrate an abrasive or grinding process and a debonding process of a single inorganic substrate bonded to a handle wafer, according to some embodiments of the present invention.

FIG. 2A illustrates a result of the process associated with block 202, according to some embodiments. As shown in FIG. 2A, an inorganic substrate 100 with thickness 110 includes a first surface 100a and a second surface 100b on an opposite side of the inorganic substrate 100 than the first surface 100a. The handle wafer or substrate 150 includes a first surface 150a and a second surface 150b on an opposite side of the handle wafer 150 than the first surface 150a. The handle wafer or substrate 150 may itself include or be an inorganic wafer or substrate made of silicon, fused silica, borosilicate glass, or boro-aluminosilicate glass. The handle wafer 150 itself may comprise or be formed of one or more inorganic wafers, according to some embodiments. A carbonaceous adhesion layer 180, applied according to the process associated with block 202, may be located between the first surface 100a of the inorganic substrate 100 and the first surface 150a of the handle substrate 150, according to some embodiments. In some embodiments, the carbonaceous adhesion layer 180 is formed as a vacuum deposited carbonaceous film with a thickness between 1 nanometer and 100 nanometers, according to some embodiments. The bonding process associated with block 202 may produce a wafer stack 130. In some embodiments, the handle substrate 150 may contain alignment mechanisms configured to perform alignment so that the inorganic substrate 100 may be positioned easily, accurately and/or reproducibly on the handle wafer 150. These alignment mechanisms may include raised regions, recessed regions, notches, or holes, according to some embodiments. Such alignment mechanisms may also be utilized for substrate 120, discussed in more detail below.

In light of the example of FIG. 2A, the processes associated with block 202 may be part of a method of processing an inorganic wafer, the method including forming a wafer stack (e.g., wafer stack 130) at least by performing a temporary bonding process to temporarily bond at least a first inorganic wafer (e.g., inorganic substrate or wafer 100) to a first surface (e.g., first surface 150a) of a handle wafer (e.g., handle wafer 150). The handle wafer itself may include at least one inorganic wafer, and the temporary bonding process may include formation of an adhesion layer (e.g., carbonaceous adhesion layer 180) between the first inorganic wafer and the first surface of the handle wafer. The adhesion layer may include a vacuum deposited carbonaceous film with a thickness between 1 nm and 100 nm. The adhesion layer thickness may preferably be between 2 nm and 50 nm, inclusive, in some embodiments.

Inorganic substrates, wafers, and handles may include, but are not limited to, glass, fused silica, synthetic quartz, glass ceramic, ceramic, aluminum oxides, crystalline material, such as sapphire, or laminated layers of such materials (for example, coated glass). Inorganic substrates, wafers, and handles may also include semiconductors such as silicon, germanium, and compound semiconductors. Compound semiconductors may include group V compounds, group III-V compounds, and group II-VI compounds. Compound semiconductors include but are not limited to gallium arsenide, gallium nitride, silicon carbide, and cadmium chalcogenides. Silicon dioxide (SiO2)-based materials may be particularly suitable in some contexts. SiO2 as an amorphous material that can be suitably disrupted by laser energy may be particularly well suited to some embodiments of the present invention since application of laser energy leads to damage regions (which may, e.g., be used as precursors to vias formed by subsequent etching processes) that have a substantially higher etch rate than neighboring undamaged regions. Furthermore, SiO2 can be etched with wet processes that exploit this difference between damaged and undamaged regions (the damaged regions, e.g., leading to vias during etching), which provides very well controlled etch rates that retain a very high degree of surface smoothness. SiO2 may be pure, commonly referred to as fused silica or fused quartz, or may contain other components including but not limited to Al, Ca, B, and Mg, according to some embodiments. The inorganic substrate thickness (110, FIG. 2A) may be any value, but preferably under 500 micrometers, in some embodiments, or more preferably at or under 200 micrometers, in some embodiments. The inorganic substrate 100 and the handle substrate 150 may be in the form of a wafer, or in the form of a panel. The dimensions of the inorganic substrate 100 and the handle substrate 150 may conform to the standard sizes used for semiconductor wafers, or may be different. The inorganic substrate 100 and the handle wafer 150, if in the form of a wafer, may comprise the flats or notches typical for semiconductor wafers, or may be perfectly round. The inorganic substrate 100 and the handle substrate 150, if in the form of a glass panel, may be any desired size up to the width practical for forming the glass. In some embodiments, each of the first surface 100a, the second surface 100b, the first surface 150a, and the second surface 150b has a root mean square ("RMS") surface roughness less than 10 nm, according to some embodiments, and preferably less than 1 nm, according to some embodiments. Inorganic substrates may be made by several processes, according to some embodiments, including fusion processes, melt-grown processes and crystal-growth processes.

In some embodiments, the inorganic carbon-containing film or carbonaceous layer 180 may be used as an adhesion layer. Appropriate carbonaceous surface modification layers allow a higher adhesion force between the first surface 100a of the inorganic substrate 100 and the first surface 150a of the handle substrate 150 than simple Van der Waals interactions between the clean surfaces, yet remain temporary even after anneals to 400° C. Carbonaceous surface modification layers may include one or more layers or films which contain carbon as a significant component. The carbon may exist in the form of polymeric chains exhibiting finite molecular weight. Alternatively, the carbon may exist as a matrix of carbon atoms bonded to form an amorphous or crystalline solid film. The carbon may exhibit $sp^2$ bonding or $sp^3$ bonding, also referred to as $sp^2$ or $sp^3$ orbital hybridization. The carbonaceous surface modification layer 180 may contain substantial quantities of other atoms. Preferred additional atoms may include hydrogen and fluorine, at concentrations below 50 atomic % relative to the entire film, or preferably below 40 atomic % relative to the entire film, according to various embodiments. Preferred carbonaceous surface modification layers may be amorphous carbon, amorphous hydrogenated carbon, diamond, diamond-like carbon, and fluorine containing carbon films, according to various embodiments. The carbonaceous surface modification layers may be deposited by any suitable deposition technique, according to some embodiments. Preferred deposition techniques may include vacuum deposition, preferably plasma enhanced chemical vapor deposition (PECVD), according to various embodiments. A particularly preferred deposition technique may be PECVD in the presence of a voltage-floating platen as used in reactive ion etch (ME) systems, according to some embodiments. Source gases for the carbonaceous modification layer deposition may include but are not limited to carbon containing gases such as methane, ethane, ethylene, propane, and non-carbon containing gases such as hydrogen, oxygen, and nitrogen. The carbonaceous modification layer deposition may include steps to modify the polarity of the surface of the carbonaceous layer 180 by forming polar chemical bonds, such as those containing nitrogen, oxygen, and hydrogen. Such formation may occur as a part or portion of the PECVD deposition processes. A preferred approach to form such modification of the polarity of the surface may include treating the carbonaceous layer 180 after deposition to a plasma containing, but not limited to, oxygen and nitrogen.

The carbonaceous surface modification layer 180 may be of any desired thickness. Layer thickness below 100 nm may be preferred, according to some embodiments, and a particularly preferred layer thickness may be below 50 nm, according to some embodiments. In this regard, the carbonaceous adhesion layer 180 may have a thickness between 1 nm and 100 nm, inclusive (i.e., inclusive of the end points), according to some embodiments. The carbonaceous adhesion layer 180 may include an exposed surface with very low roughness. The surface roughness of the carbonaceous adhesion layer 180 may be below 10 nm, preferably below 1 nm in RMS roughness, according to some embodiments. The carbonaceous surface modification layer 180 may be applied to either or both surfaces that are to be bonded. In a non-limiting example, the carbonaceous surface modification layer 180 may be applied either or both of the surfaces to be bonded, e.g., to the first surface 100*a* of the inorganic substrate 100, to the first surface 150*a* of the handle substrate 150, or to both the first surface 100*a* of the inorganic substrate 100 and the first surface 150*a* of the handle substrate 150. In this regard, the surfaces to be bonded are the two surfaces from different substrates that are contacted during bonding, as opposed to the two opposing surfaces of a single substrate, according to some embodiments.

The bonding or bonding type between the inorganic substrate 100 and the handle substrate 150 may be of any type that permits the two substrates to remain in adhesion during all envisioned processing steps (e.g., at least one or more of the methods of FIG. 1, one or more of the methods of FIG. 6, or one or more of the methods of each of FIG. 1 and FIG. 6, according to some embodiments), but allows debonding without excessive force when required, according to some embodiments. A preferred method of bonding may be Van der Waals bonding, in which the substrates are held together due to Van der Waals forces resulting from atomic constituents present on the two surfaces (e.g., surface 100*b* of the inorganic substrate 100 and the surface of the carrier or blocking substrate) being bonded. Van der Waals forces may result in bonded substrates with bond energies ranging from 20 to 300 mJ/m2 as measured by a razor insertion technique (see, e.g., Gillis, Peter P., et al., "Double-Cantilever Cleavage Mode of Crack Propagation", Journal of Applied Physics 35, 647 (1964)). Van der Waals bonds may be modified by treating surfaces to be bonded with processes including, but not limited to, cleaning, acid exposure, base exposure, plasma treatments, and ozone treatments, according to various embodiments. The bonding or bonding type may also include some number of covalent bonds that form at room temperature or above and serve to covalently connect moieties on the two respective surfaces. In this regard, in some embodiments, the bonding of the first surface 100*a* of the inorganic substrate 100 to the first surface 150*a* of the handle substrate 150 may be Van der Waals bonding or Van der Waals bonding assisted by covalent bonding. Van der Waals bonding assisted by a covalent bonding may be particularly preferred in some contexts since Van der Waals bonds alone may not be sufficient to hold the substrates in contact with each other during all anticipated wet processing. Typical covalent bonds may include siloxane bonds (—Si—O—Si—), and silicon bonds to any number of carbon-based groups that exist on the carbonaceous surface modification layer 180, according to various embodiments. Covalent bonds can be relatively strong, leading to bond energies of greater than 2000 mJ/m2, resulting in bonds that are relatively difficult to debond in some contexts. Such a strong bond may be preferred in some situations where it is desired to leave the handle substrate 150 or the like permanently bonded to the inorganic substrate 100. In other situations, it may be desirable to debond or remove the handle substrate 150 or the like. In at least some of these cases, it may be preferable that the bond energy composed of Van der Waals forces and covalent boding forces, be less than 1,200 mJ/m$^2$, preferably less than 1,000 mJ/m$^2$, and preferably less than 800 mJ/m$^2$, according to various embodiments. In some embodiments, the bond energy may be between 200 mJ/m$^2$ and 1,200 mJ/m$^2$. In this regard, in some embodiments, the adhesion layer (e.g., the carbonaceous adhesion layer 180) may provide a bond energy less than 1,200 mJ/m$^2$, preferably less than 1,000 mJ/m$^2$, and preferably less than 800 mJ/m$^2$, according to various embodiments. In some embodiments, the bond energy provided by the adhesion layer (e.g., the carbonaceous adhesion layer 180) may be between 200 mJ/m$^2$ and 1,200 mJ/m$^2$. After bonding, bonds may be modified or undergo any number of processes including annealing, compression, and wet treatments also as part of block 202 in FIG. 1, according to some embodiments. Annealing may be at any suitable temperature, time, and environment, preferably at or below 400° C. and in an inert gaseous or vacuum environment, according to some embodiments. It should be noted that the above discussions regarding block 202 in FIG. 1 also apply to block 222 in FIG. 6, discussed in more detail below.

Figure 2B:
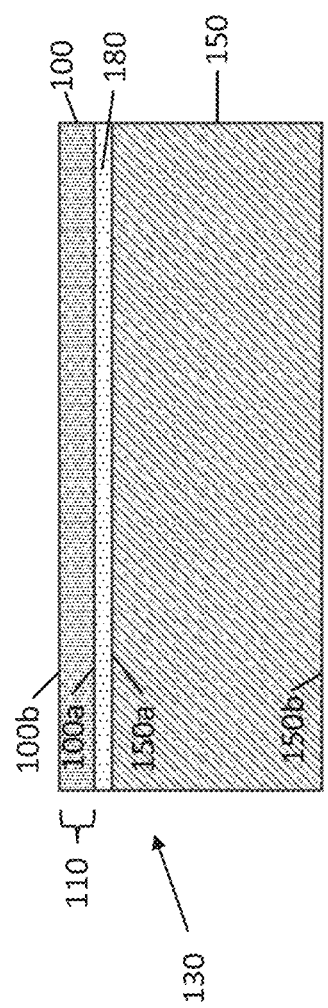

Turning now to FIG. 1, block 204, an abrasive process may be applied to at least part of the wafer stack 130, the abrasive process reducing the thickness 110 of the first inorganic wafer 100 of the wafer stack 130, as illustrated by a comparison of FIG. 2A and FIG. 2B, according to some embodiments. The abrasive process according to block 204 may be applied to at least the second surface 100*b* of the inorganic substrate 100, according to some embodiments. As illustrated by the comparison of FIG. 2A and FIG. 2B, the abrasive process may cause the thickness 110 of substrate 100 to be reduced, while maintaining contact of the inorganic substrate 100 to the handle substrate 150 by way of the adhesion layer 180, according to some embodiments. The initial thickness 110 (e.g., the thickness prior to applying the abrasive process associated with block 204) of the inorganic substrate 100 shown in FIG. 2A may be between 0.3 mm (300 micrometers) and 1 mm, inclusive, according to some embodiments. After or upon completion of applying abrasive process associated with block 204 in FIG. 1, the thickness 110 shown in FIG. 2B of the inorganic substrate 100 may be in the range of 0.01 mm (10 micrometers) to 0.2 mm (200 micrometers), inclusive, according to some embodiments.

The outer edge 300 of the substrate 100 may have any suitable shape, including a cut edge, a break cut edge, or a ground edge, according to some embodiments. In some embodiments, it may be preferable for the edge of the substrate 100 to have a contour of some shape that minimizes or otherwise reduces the presence of sharp or acute angles that can lead to breakage. To elaborate, referring to FIG. 2C, for example, an edge contour 300*a* on substrate 100 of thickness 110 (in this example, such thickness 110 being shown prior to the abrasive process according to block 204) may be characterized by a point 310a of maximum diameter and the vertical distance 320a from that point 310a on the edge contour 300a to the first surface 100a of the substrate 100. In this case, surface 100a is also the surface bonded to handle substrate 150. In the example of FIG. 2C, the intended thickness 350 of the substrate 100 after the grinding process (e.g., according to block 204) is shown by line 330. In other words, the intended thickness 350 shown by line 330 may be the thickness 110 of the substrate 100 after applying the abrasive process according to block 204. If the point of maximum diameter 310a at a distance 320a from the first surface 100a of the substrate 100 is about ½ the substrate thickness 110 (prior to grinding), as shown in FIG. 2C, such a condition typically leads to an acute angle 340 after the grinding operation when the thickness of the substrate 110 is reduced to thickness 350. Such an acute or sharp angle may lead to areas of the substrate 100 prone to fracture, thus promoting substrate breakage in some contexts.

Accordingly, some embodiments of the present invention utilize or provide substrates with an asymmetric edge contour 300b such as that shown in FIG. 2D. In such a case, the point of maximum diameter 310b is at a distance 320b from the first surface 100a of the substrate 100 that is less than the desired thickness 350 of the post-grinded substrate 100 (e.g., after performing the abrasive process according to block 204) shown by line 330. It may be preferable in some embodiments that the position of the point of maximum diameter 310b be located at a distance from the first surface 100a of 0.1 to 0.9 times the final substrate thickness 350, and preferably in some embodiments from 0.2 to 0.8 times the final substrate thickness 350.

The discussion above with respect to FIGS. 2C and 2D and inorganic substrate 100 applies equally well to substrate 120, discussed in more detail below, according to some embodiments.

The abrasion process associated with block 204 may include treating the second surface 100b of the inorganic substrate 100 with an abrasive material and force and/or motion to remove material from the inorganic substrate 100, according to some embodiments. In some embodiments, the abrasion may occur with a grinding tool including, but not limited to, a wheel or a cup containing an abrasive compound. The grinding tool may be bonded using any suitable bonding technique including, but not limited to, vitrified, vitreous, resinoid, or resin bonding. The abrasion may occur with a grinding or polishing pad impregnated with an abrasive. The abrasion may occur with a pad or other vehicle using a loose grinding or polishing slurry. The abrasion process may reduce the thickness 110 of inorganic substrate 100 while yielding a suitable final or post-grinding surface of inorganic substrate 100, such as second surface 100b shown in FIG. 2B (as compared to the second surface 100b shown in FIG. 2A). The final or post-grinding surface 100b of inorganic substrate 100 may have a roughness less than 10 nm, in some embodiments, and preferably less than 2 nm in some embodiments. The abrasion process associated with block 204 may be performed in a way to leave low or minimal damage at or below the second surface 100b of inorganic substrate 100. Low or minimal damage may be achieved by a successive treatment of several abrasives with different abrasive particle size, such as with particle sizes of the abrasive decreasing with successive grinding steps, according to some embodiments. Low or minimal damage may be achieved by a successive treatment of several abrasives with different abrasive properties, such as hardness, and such as with hardness of the abrasive decreasing with successive grinding steps, according to some embodiments.

In an abrasion process, the substrate may be ground, lapped, or polished using a flat surface containing an abrasive, leading to a resulting flat surface on the substrate after abrasion. If an adhesion layer has substantial thickness variations, the process of grinding may transfer those thickness variations into the thinned substrate 100, leading to variations in thickness of the resulting substrate, also known as total thickness variation (TTV). With conventional adhesive processes, typical adhesive thickness values range from 10 um to 100 um, and variations of 2 to 20 um are not uncommon, which can lead to resulting substrate thickness variations in the range of 2 to 20 um. According to some embodiments of the inventive bonding process (e.g., according to block 202 in FIG. 1 and block 222 in FIG. 6, discussed in more detail below), the adhesion layer (e.g., some embodiments of at least the adhesion layer 180, adhesion layer 182 (discussed in more detail below), adhesion layer 190 (discussed in more detail below), adhesion layer 192 (discussed in more detail below), and adhesion layer 194 (discussed in more detail below)) may, for example, be or include one or more carbonaceous modification layers or other adhesive that the inventors learned is effective at less than or equal to 500 nm (0.5 um) thick, and even less than 50 nm (0.05 um) thick, with the maximum TTV using such an adhesion layer being less than 0.5 um, according to various embodiments. In some embodiments, such an adhesion layer may have a thickness between 1 nm and 100 nm, inclusive. It was unexpected to the inventors that such a thin adhesion layer, which cannot conform to substrate surface variations, and also which has low compliance with respect to forces applied during the abrasion process, could survive such a process.

Figure 2E:
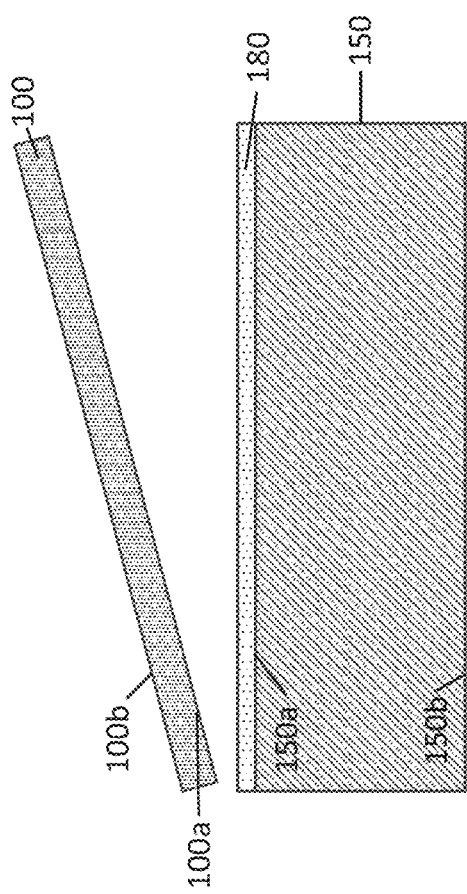

Referring again to FIG. 1, block 206, and now FIG. 2E, the thinned substrate 100 may be debonded from the wafer stack 130 to yield a freestanding thin substrate 100 as shown in FIG. 2E, which may be available for use in one or more downstream applications. Debonding may occur using any process that separates the thinned inorganic substrate 100 from handle wafer or substrate 150. The debonding process associated with block 206 may include, according to some embodiments, inserting a thin metal or plastic between the inorganic substrate 100 and the handle wafer 150, and pushing the thin metal or plastic in order to separate the two substrates. Preferred debonding methods associated with block 206, in some contexts, may include employing a debonding apparatus that holds the thinned inorganic substrate 100 flat while pulling the thicker handle substrate 150 away, according to some embodiments. The debonding method associated with block 206 may use an adhesive or tape or dicing tape to hold the thinned inorganic substrate 100, according to some embodiments. Commercial debonding apparatuses, such as the Cost Effective Equipment ("CEE", of Rolla, Missouri, USA) Apogee™ Mechanical Debonder may be preferable in some contexts.

According to some embodiments, the abrasive process associated with block 204 may be a double-sided lapping and polishing ("DSLP") process. In the DSLP process, a substrate or substrate stack may be held between lapping or polishing plates, typically an upper and a lower plate that, depending on machine design, can rotate either in the same direction or opposite directions, or remain stationary. The substrate or substrate stack and plates move relative to each other in the presence of an abrasive. The upper and lower plates may grind a first surface and an opposing second surface of a substrate or substrate stack at the same time, and the upper and lower plates may be held in very tight tolerance and parallelism. As a result, the abraded substrate or substrate stack may exhibit a high degree of flatness. Additionally, in the case of a handle in which substrates are attached to either surface of the handle, it is possible to provide an abrasive process to both of said substrates simultaneously to yield a high through. Commercial DSLP machines may be preferable in some contexts for DSLP processing, such as the PR Hoffman line including the PR and Servo RS series, PR Hoffman being of 1517 Commerce Avenue, Carlisle PA, 17015, USA. Application of such a DSLP will be described with respect to FIG. 3A, where two inorganic substrates (inorganic substrate 100 and inorganic substrate 120) have been bonded to opposite sides of the handle substrate 150 according to the processes associated with block 202 to form a wafer stack 135, according to some embodiments. As with FIG. 2A, the first inorganic substrate 100 in FIG. 3A includes the first surface 100a and the second surface 100b on an opposite side of the inorganic substrate 100 than the first surface 100a, with the thickness 110 of the first inorganic substrate 100 being between the first surface 100a and the second surface 100b. The second inorganic substrate 120 includes a first surface 120a and a second surface 120b on an opposite side of the inorganic substrate 120 than the first surface 120a, with a thickness 112 of the second inorganic substrate 112 being between the first surface 120a and the second surface 120b. As with FIG. 2A, the handle substrate 150 includes the first surface 150a and the second surface 150b on an opposite side of the inorganic substrate 150 than the first surface 150a. In view of FIG. 3A, the forming of the wafer stack 135 according to the processes associated with block 202 in FIG. 1, may include temporarily bonding at least (a) the first surface 100a of the first inorganic wafer 100 to the first surface 150a of the handle wafer 150, and (b) the second inorganic wafer 120 to the second surface 150b of the handle wafer 150, according to some embodiments. In some embodiments, the temporarily bonding includes formation of an adhesion layer 180 between the first surface 100a of the first inorganic wafer 100 and the first surface 150a of the handle wafer 150, and includes formation of an adhesion layer 182 between the first surface 120a of the second inorganic wafer 120 and the second surface 150b of the handle wafer 150, according to some embodiments. In some embodiments, each of the adhesion layer 180 and the adhesion layer 182 includes a vacuum deposited carbonaceous film with a thickness between 1 nm and 100 nm, inclusive. Each adhesion layer thickness may preferably be between 2 nm and 50 nm, inclusive, in some embodiments. In this regard, the adhesion layer 180 in FIG. 3A may be a first carbonaceous adhesion layer 180, and the adhesion layer 182 may be a second carbonaceous adhesion layer 182. The resulting structure produces substrate stack 135.

Figure 3A:
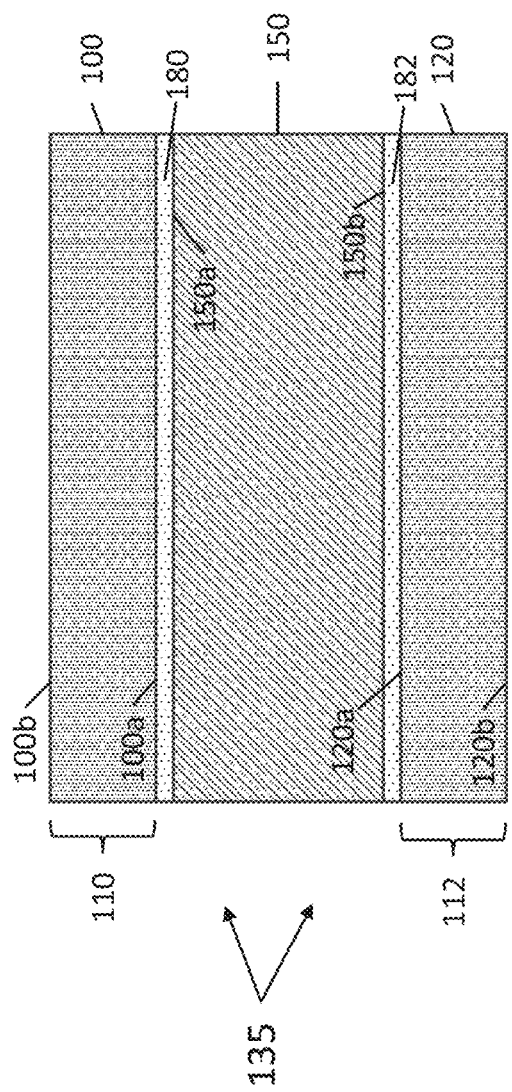

Referring again to FIG. 1, the wafer stack 135 may be subjected to an abrasive process associated with block 204, according to some embodiments. Referring to FIG. 3B, the abrasive process may be applied to at least the second surface 100b of the first inorganic substrate 100 and concurrently applied to at least the second surface 120b of the second inorganic substrate 120, using, for example, a process such as DSLP. As illustrated by a comparison of FIG. 3A and FIG. 3B, the abrasion process associated with block 204 may cause the thickness 110 of the first inorganic substrate 100 to be reduced, while maintaining contact of the first inorganic substrate 100 to the handle substrate or wafer 150 by way of the adhesion layer 180, and, simultaneously, the abrasion process associated with block 204 may cause the thickness 112 of the second inorganic substrate 120 to be reduced, while maintaining contact of the second inorganic substrate 120 to the handle substrate or wafer 150 by way of the adhesion layer 182. The initial, or pre-abrasion thickness (e.g., prior to applying the abrasive process) of each of the first inorganic substrate 100 and the second inorganic substrate 120, as shown in the state of FIG. 3A, may be between 0.3 mm (300 micrometers) and 1 mm, inclusive. After or upon completion of applying the abrasive process associated with block 204, the thickness of each of the first inorganic substrate 100 and the second inorganic substrate 120, as shown in the state of FIG. 3B, may be between 0.01 mm (10 micrometers) and 0.2 mm (200 micrometers), inclusive, according to some embodiments.

Figure 3C:
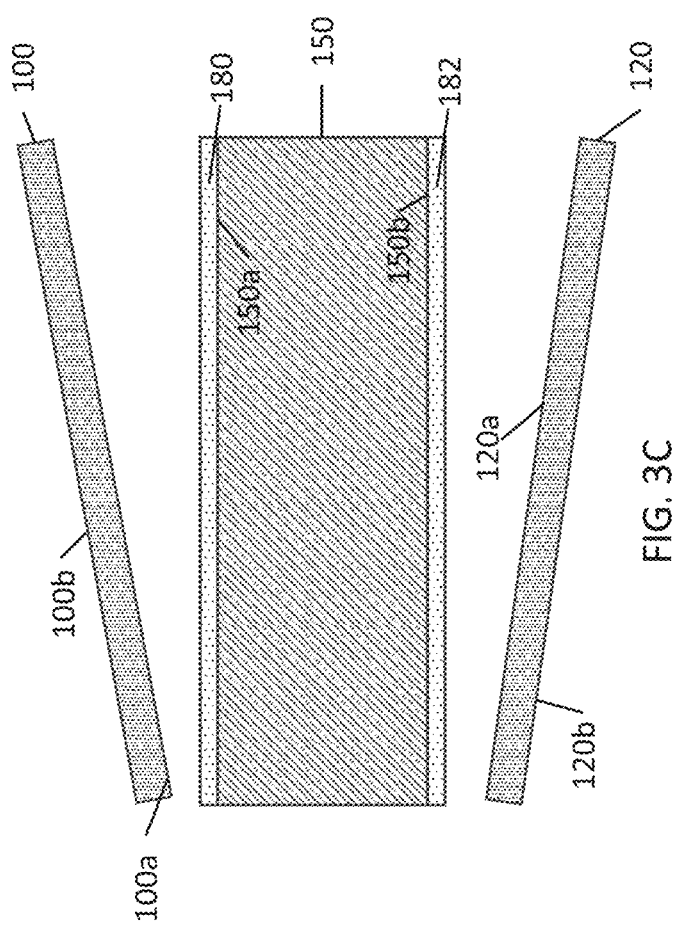

Referring again to FIG. 1 and now FIG. 3C, the thinned first inorganic substrate 100 and the thinned second inorganic substrate 120 may be debonded from the wafer stack 135 to yield freestanding thin substrates according to debonding processes described herein with respect to block 206, according to various embodiments.

After debonding the substrate may contain small defects introduced by the grinding process associated with block 204, such as micro cracks and chips, that can lead to fracture of the glass during handling. In some embodiments, after debonding, the substrate 100 may be etched in order to remove or heal these defects. Such an etch may be done in any etchant capable of etching the substrate. The etch may be effective with only small amounts of material removal. In some embodiments, the etch may remove from 0.05 to 10 um of material, and preferably in some embodiments from 0.1 to 5 um of material. According to some embodiments, this 'healing' etch may also be applied to substrate 120, discussed in more detail below.

Figure 4:
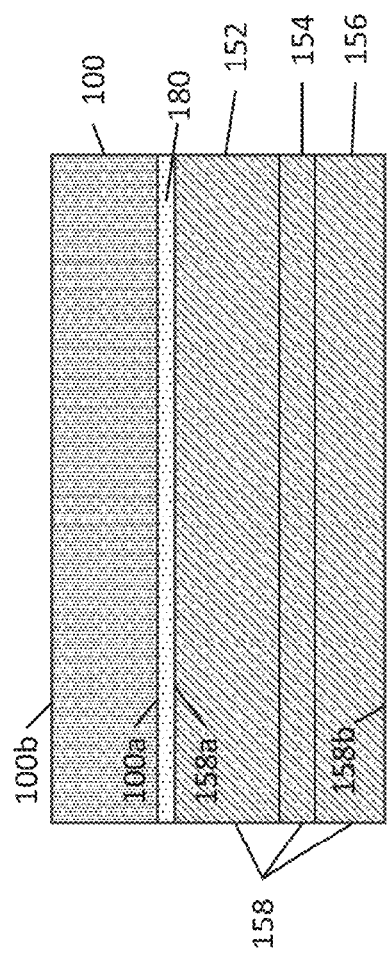
FIG. 4 illustrates a wafer stack for grinding with a handle composed of several substrates, according to some embodiments of the present invention.

According to some embodiments, the handle substrate or wafer 150 may be composed of several substrates. For example, the handle substrate or wafer 150 may be a handle stack 158 illustrated by FIG. 4. The handle stack 158 may include individual substrates 152, 154, and 156, although any useful number of substrates may be used according to various embodiments. The handle stack 158 may exhibit at least some of the same or similar characteristics as the handle substrate 150, such as including a first surface 158a of the handle stack 158, and a second surface 158b of the handle stack on the furthest possible opposing surface of the handle stack 158 from the first surface 158a. The bonding of substrates the individual substrates (e.g., individual substrates 152, 154, 156) to form handle stack 158 may be of any form including temporary bonding or permanent bonding, according to various embodiments. Temporary bonding may include, but not be limited to, modification layers, carbonaceous modification layers, and polymeric adhesives, according to some embodiments. Permanent bonding may include, but not be limited to, covalent bonding, and thermo compression bonding, according to some embodiments. Although shown in FIG. 4 as having a single inorganic substrate 100, the handle stack 158 may also be used in a manner as shown in FIGS. 3A-3C to process two substrates, one on each surface 158a, 158b. After an abrasion process according to block 204, the thinned substrate 100 may be debonded at the interface containing adhesion layer 180, or it may be debonded at any other interface that has a temporary bond, according to some embodiments as described herein.

Figure 5:
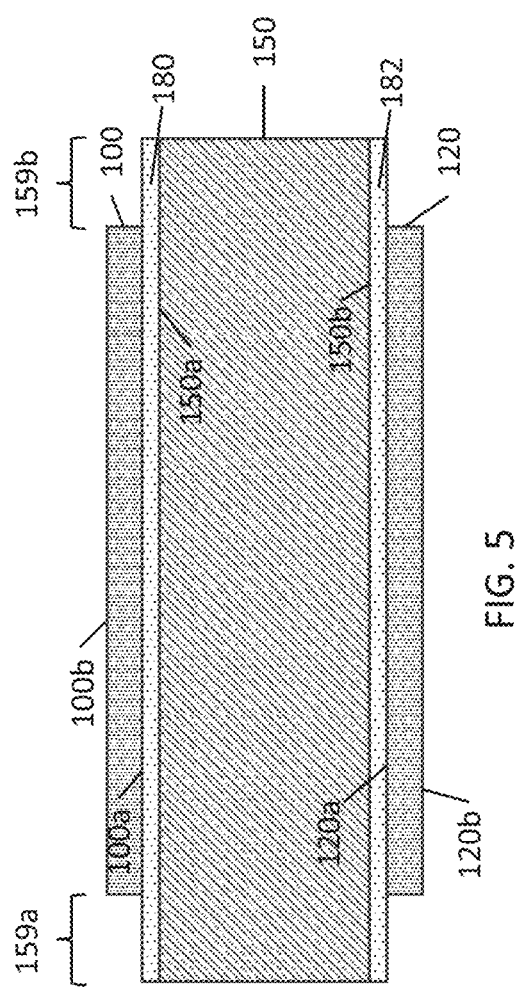
FIG. 5 illustrates a wafer stack for grinding with a handle with a larger diameter than an attached inorganic substrate, according to some embodiments of the present invention.

The handle wafer (which may, e.g., be handle wafer 150 or handle wafer stack 158, according to some embodiments) may have a thickness range of 0.3 mm to 10 mm, inclusive, according to some embodiments. Thick substrates (e.g., 1 to 10 mm) may be useful as handle wafers since they can maintain a high degree of flatness during the abrasion process and are relatively easy to handle with low concerns for breakage, according to some embodiments. The handle wafer may have the same diameter or width as the inorganic substrate(s), as shown for example in FIG. 2A and FIG. 3A, where the edges of the handle wafer and the bonded inorganic substrate(s) line up. Alternatively, the handle wafer may have a diameter that exceeds the diameter of the inorganic substrate(s) by at least 1 mm, according to some embodiments, as shown, for example, by FIG. 5, where the edges of the handle wafer and the bonded inorganic substrate(s) do not line up. In many abrasion processes, for example the DSLP process, the force applied to the substrate to cause relative motion from an abrasion surface, such as a grinding plate, is applied to the edge of the substrate or substrate stack. As such, when the handle substrate has a diameter that exceeds the inorganic substrate, this force may be applied predominantly or exclusively to the handle substrate and not the inorganic substrate(s), thus preventing possible damage to the inorganic substrate(s). FIG. 5 shows an example configuration of a handle wafer 150 with a diameter or width exceeding that of one or more bonded inorganic substrates (e.g., first inorganic substrate 100 and second inorganic substrate 120 in the example of FIG. 5) by excess diameters or widths 159a, 159b, according to some embodiments. The example of FIG. 5 shows a case that corresponds to that of FIGS. 3A-3C with an inorganic substrate on both sides of the handle wafer 150, although other embodiments include an excess diameter of the handle wafer that corresponds to that of FIGS. 2A, 2B, and 2E with an inorganic substrate on only one side of the handle wafer.

FIG. 6 illustrates methods of forming a tapered via in an inorganic substrate, according to some embodiments of the present invention. Although FIG. 6 includes four blocks: block 220, block 222, block 224, and block 226, in an illustrated sequence, each block corresponding to respective actions, various embodiments of the present invention include a subset (one or more) of such blocks in same or different sequences (when more than two blocks are included). It should be noted that each block in FIG. 6 may be considered a method step, according to some embodiments. Further, various embodiments of the present invention are not limited to one, or more, or all of the actions shown in the blocks of FIG. 6, and some embodiments of the present invention include other actions described herein not shown in FIG. 6 in addition to or in lieu of the actions shown in FIG. 6. In this regard, FIG. 6 is provided merely for illustration purposes and is not limiting.

Referring to the process flow chart in FIG. 6, block 220 may include obtaining an inorganic substrate that includes at least one via through the inorganic substrate. The via may include a waist where, e.g., a minimum internal cross-sectional diameter of the via exists, according to some embodiments.

Figure 7A:
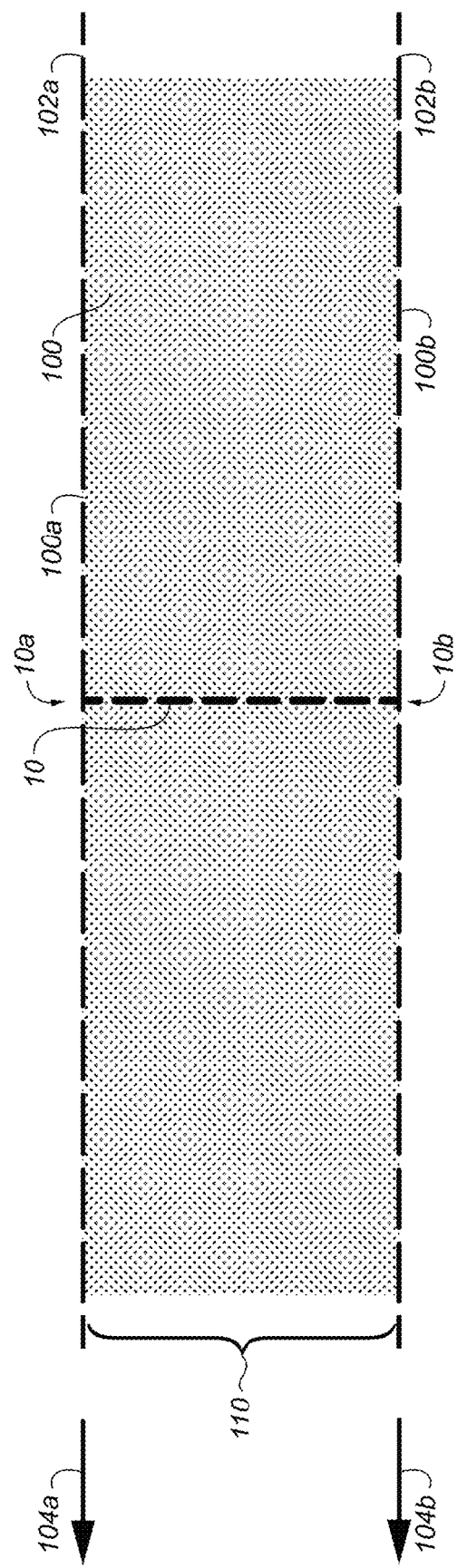

A via, also referred to as a through-hole, can be formed by a variety of methods, including lithography of photolithographic glass, sand-blasting, electric discharge drilling, swift heavy ion tracks, and many versions of laser drilling. In some cases, the holes are formed to the correct opening size directly. Referring to FIG. 7A, in some cases the positions of the vias in a substrate 100 are established by a method which creates a damage track 10 or preformed opening or pilot hole in the glass, while a subsequent wet etching process enlarges the damage track to create a through-hole with the desired diameter. When processing a material, such as glass, the details of the via formation typically have to be carefully designed to create smooth, circular, vias of the correct opening diameter with low cracking around the holes. Furthermore, speed of sample throughput and capital costs for the manufacturing equipment are important parameters for a manufacturing process.

Although the inorganic substrate 100 shown, for example, by FIG. 7A contains a single damage track 10, typically, the inorganic substrate 100 will contain a plurality of damage tracks through the thickness of the substrate, for example, from the first surface 100a to the second surface 100b, at desired via locations. A damage track, including the damage track 10, may be produced by any suitable process, such as the application of high-energy particles or a laser drilling process. For reasons of high through-put, each damage-track may be produced by a laser designed to create a large number of damage tracks in the inorganic substrate 100. Each damage track may be created with a single laser shot. Alternatively, each laser damage track may be produced with a plurality of laser pulses that are directed at the same region of the substrate. According to some embodiments, a preferred process in some contexts is a laser process that produces well-formed damage tracks, without producing cracks in the surrounding inorganic substrate material. In some embodiments, particularly preferable processes are those that use a short laser pulse (e.g., from 0.1 nanosecond (1e-10) to 1 femtosecond (1e-15)) with an optical system that creates a line focus system to form damage tracks through the inorganic substrate 100. A damage track, according to some embodiments, is assumed to be produced in a line through the entire thickness 110 of the inorganic substrate 100. In some embodiments, the damage track 10 may be a small (diameter less than or equal to 1 micrometer) hole through the inorganic substrate 100. In other embodiments, the damage track 10 may have portions of its length that are open, but portions that are filled with substrate material with a modified atomic arrangement relative to the bulk of the substrate.

In some embodiments, a via including a waist may be formed by a double-sided opening process ("DSOP") applied simultaneously to both surface 100a and surface 100b of the inorganic substrate 100 to produce or increase the size of openings at the ends of the damage track 10 and to form, or increase the internal diameter (taken perpendicular to the thickness 110) of, a pathway along the damage track 10 in the inorganic substrate 100. In some embodiments, the DSOP produces a via through the inorganic substrate 100 from the damage track 10. In some embodiments, the DSOP may include submerging the inorganic substrate 100 containing the damage track 10 in a wet etch solution, which can either be an acidic solution or a basic solution. In this regard, the DSOP may include a wet etching process concurrently applied to the first surface 100a of the inorganic substrate 100 and the second surface 100b of the inorganic substrate 100.

Figure 7B:
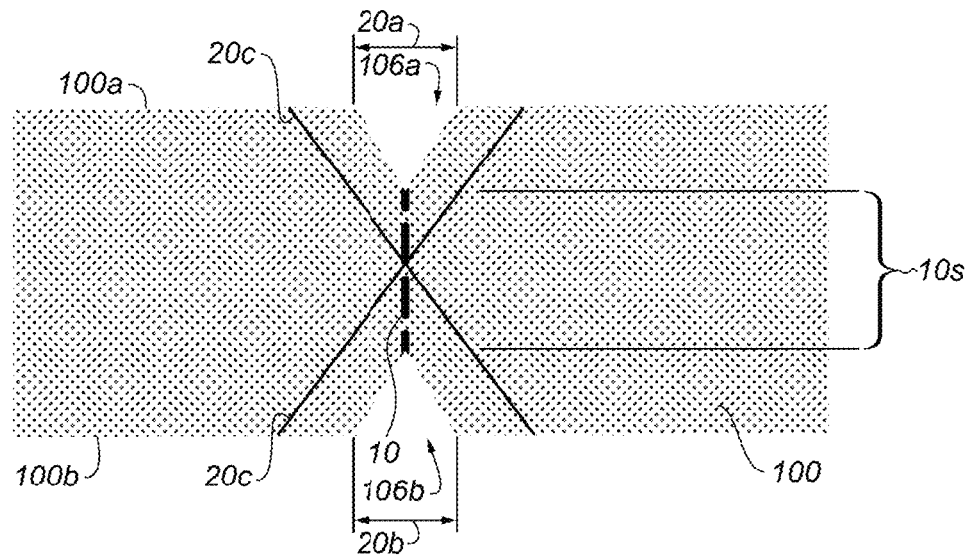
Figure 7C:
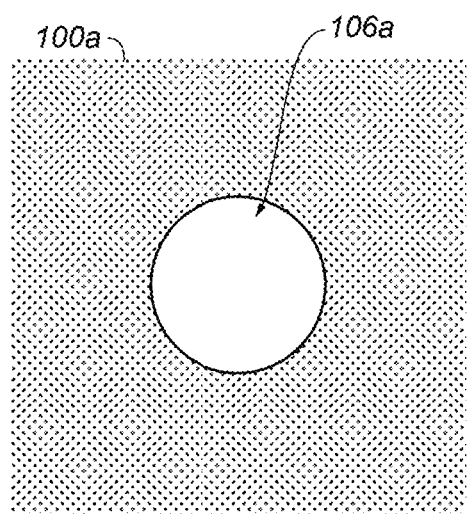

FIGS. 7B and 7C illustrate an example of a first via-formation state of the inorganic substrate 100 subjected to the DSOP, according to some embodiments. In some embodiments, the first via-formation state is an interim via-formation state at a time during but before completion of the DSOP, according to some embodiments. In some embodiments, the wet etch of the DSOP is isotropic and causes, as illustrated by a comparison of FIGS. 7A and 7B, the diameter of an opening at each end of the damage track 10 to grow as the etch depth increases along the line of the damage track 10. In the first via-formation state of FIG. 7B, an opening 106a in the first surface 100a and an opening 106*b* in the second surface 100*b* has grown compared to the state of FIG. 7A. In FIG. 7B, the lines 20*c* serve as guides to the eye for generally how the openings at the surfaces 100*a*, 100*b* become larger as the duration of the wet etch for the DSOP increases along the damage track 10, the length of which becomes reduced with increased duration of the wet etch (to a length 10s in the first via-formation state of FIG. 7B). Referring to FIG. 7C, a top-down view of the opening 106*a* is illustrated, showing its circular shape. The opening 106*b* has the same or a similar circular shape. Although FIG. 7C illustrates a perfect circle for example purposes, it is to be understood that variations and imperfections would likely exist.

FIGS. 7D, 7E, and 7F illustrate examples of subsequent via-formation states subsequent to the first state of FIGS. 7B and 7C of the inorganic substrate 100 subjected to the DSOP, which may be applied as at least part of the processes associated with block 220 in FIG. 6, according to some embodiments of the present invention. For example, if the wet etching included in the DSOP described above with respect to FIGS. 7B and 7C is continued long enough, it results in a via or pathway 30 with an hourglass or hourglass-like profile as illustrated in FIGS. 7D and 7E, and as illustrated three dimensionally in FIG. 7F. Referring to FIG. 7F, a longitudinal axis 32 of the via or pathway 30 can be said to run through the substrate 100 where the damage track 10 was originally positioned, according to some embodiments. The longitudinal axis 32 may be perpendicular to (a) an extension direction (e.g., at least extension direction 104*a*) of the first surface 100*a* of the inorganic substrate 100, (b) an extension direction (e.g., at least extension direction 104*b*) of the second surface 100*b* of the inorganic substrate 100, or both (a) and (b). In this regard, in some embodiments, the longitudinal axis 32 may be perpendicular to (i) a first plane 102*a* (shown in FIG. 7A in broken line) in which the first surface 100*a* of the inorganic substrate 100 resides or substantially resides, (ii) a second plane 102*b* (shown in FIG. 7A in broken line) in which the second surface 100*b* of the inorganic substrate 100 resides or substantially resides, or both (i) and (ii). In some embodiments, the longitudinal axis 32 bisects a width of the via or pathway (e.g., via or pathway 30 or resultant via or pathway 30*a* discussed in more detail below) at least at one or both of the openings of the via or pathway in the first surface 100*a* and second surface 100*b* of the inorganic substrate 100. In some embodiments, the longitudinal axis 32 proceeds through a center of a lateral cross section of either or both of the openings (e.g., openings 106*a*2, 106*b*2 in the example of FIG. 7E) in surfaces 100*a*, 100*b*, the lateral cross section(s) residing within the plane(s) (e.g., first plane 102*a*, second plane 102*b*, or both) of the respective opening(s). At different positions along the longitudinal axis 32 (e.g., which may be considered to be along a length of the via or pathway 30 in some embodiments) within the via or pathway 30, the cross-sectional diameter of the via or pathway 30 will vary. In this regard, the varying cross-sectional diameters of the via or pathway 30 may be considered varying diameters of lateral cross-sections of the via or pathway 30, the lateral cross-sections (e.g., lateral cross-sections 31 in FIG. 7F) taken perpendicular to the longitudinal axis 32 of the via or pathway 30, or taken perpendicular to the first plane 102*a*, the second plane 102*b*, or both the first plane 102*a* and the second plane 102*b*, or taken perpendicular to an extension direction (e.g., at least extension direction 104*a*) of the first surface 100*a* of the inorganic substrate 100, an extension direction (e.g., at least extension direction 104*b*) of the second surface 100*b* of the inorganic substrate 100, or both an extension direction (e.g., at least extension direction 104*a*) of the first surface 100*a* of the inorganic substrate 100 and an extension direction (e.g., at least extension direction 104*b*) of the second surface 100*b* of the inorganic substrate 100.

In some embodiments, the via-formation state represented by FIG. 7D is a state of the via or pathway 30 upon conclusion or after completion of the DSOP. In some embodiments, the via-formation state represented by FIG. 7E is a state of the via or pathway 30 upon conclusion of the DSOP. Accordingly, depending on the desired three-dimensional shape of the via or pathway 30, the DSOP may be concluded at different times, e.g., such that an earlier conclusion of the DSOP (e.g., earlier than the state of FIG. 7E) may result in a via or pathway 30 in the state of FIG. 7D, and a later conclusion of the DSOP (e.g., later than the state of FIG. 7D) may result in a via or pathway 30 in the state of FIG. 7E, which illustrates a larger via or pathway 30 with a larger waist W2 compared to FIG. 7D, due to the longer wet etching process associated with FIG. 7E, according to some embodiments.

FIG. 7D illustrates a via or pathway 30 produced by at least part of the DSOP, the via or pathway 30 including a first opening 106*a*1 having a diameter 20*a*1 at surface 100*a*, and a first opening 106*b*1 having a diameter 20*b*1 at surface 100*b*, which is equal or substantially equal to diameter 20*a*1 of the first opening 106*a*1 at surface 100*a*, according to some embodiments. The smallest cross-sectional diameter W1 of the via or pathway 30, located inside the inorganic substrate 100, may be referred to as the waist of the via or pathway 30. In the example of FIG. 7D, the waist W1 is smaller than the diameter 20*a*1 of the opening 106*a*1 at surface 100*a* and is smaller than the diameter 20*b*1 of the opening 106*b*1 at surface 100*a*. Further, although a comparison of diameters is provided in the above examples to determine a location of the waist, other internal dimensions of the via or pathway 30 may be used to determine the location of the waist of the via or pathway, according to some embodiments. For example, the waist of the via or pathway 30 may be determined as the location along the longitudinal axis 32 of the via or pathway 30 having the smallest lateral two-dimensional cross-sectional area, according to some embodiments. In instances where diameters are used to determine the location of the waist, all diameters may be required to extend in the same directions or reside within a same plane taken along the longitudinal axis 32 (e.g., a profile of the via or pathway 30 that is perpendicular to the lateral cross-sections of the via or pathway 30), according to some embodiments. In some embodiments, where several diameters or lateral cross-sectional areas or other compared dimension of the via or pathway 30 have a same minimum value, the waist may be determined to be located at the point along the longitudinal axis 32 where the dimension first reaches that minimum value, when proceeding along the longitudinal axis 32 from the first surface 100*a* toward the second surface 100*b*, according to some embodiments. Alternatively, in some embodiments, where several diameters or lateral cross-sectional areas or other compared dimension of the via or pathway 30 have a same minimum value, the waist may be determined to be located at the point along the longitudinal axis 32 where the dimension first reaches that minimum value, when proceeding along the longitudinal axis 32 from the second surface 100*b* toward the first surface 100*a*, according to some embodiments.

As discussed above, when comparing FIG. 7D to FIG. 7E, further etching will continue to enlarge the openings, expanding first opening 20a1 to first opening 20a2, and expanding first opening 20b1 to first opening 20b2, and may also change the ratio of the waist dimension to the dimension of either of the first openings in the first surface 100a and second surface 100b, respectively. In this regard, the ratio between a dimension of the waist and a dimension of either of the openings of the via or pathway 30 at the two surfaces 100a, 100b is determined by details of the etchant solution composition, conditions of the etch bath, including agitation and temperature, and time in the solution. The ratio of the waist dimension to the dimension of either of the first openings in the first surface 100a and second surface 100b may be less than or equal to 1 in some embodiments. According to some embodiments, a ratio of less than 1 will indicate an hourglass via, which after a grinding process can produce a tapered final via, which may be a desirable shape at least for some via fill or plating operations. However, in some embodiments, it may be specifically desirable to have that ratio be approximately 1, meaning a nearly cylindrical via. In such a case, the resulting via after grinding will also be cylindrical, which may be suitable at least in some via fill and plating operations.

In some embodiments, the DSOP produces a via opening at surface 100a (at each of the states of FIGS. 7B, 7D, and 7E) that is symmetrical or substantially symmetrical to the opening produced at surface 100b, according to some embodiments. The DSOP produces a via opening (e.g., opening 106a, opening 106b, opening 106a1 (FIG. 7D), opening 106b1 (FIG. 7D), opening 106a2 (FIG. 7E), or opening 106b2 (FIG. 7E)) and an internal via diameter that is smooth and without cracks, and preferably circular, according to some embodiments, as shown, e.g., with FIGS. 7C and 7F. According to some embodiments, circular means the various diameters of the opening (e.g., opening 106a, opening 106b, opening 106a1 (FIG. 7D), opening 106b1 (FIG. 7E), opening 106a2 (FIG. 7E), or opening 106b2 (FIG. 7E)) or a lateral cross-section of an internal region of the via or pathway 30 measure substantially the same value regardless of the orientation of the diameter measurement in the respective plane (e.g., plane 102a or plane 102b, respectively in the case of the openings at surfaces 100a, 100b, or within the plane of the respective lateral-cross section of an internal portion of the via or pathway 30), according to some embodiments. The circularity of each opening or lateral cross-section of the via or pathway 30 may be characterized by the ratio of the minimum diameter to the maximum diameter of the opening or lateral cross-section as measured in a large number of possible diameter-measurement orientations. A circularity of greater than 0.8 is preferred, according to some embodiments. Alternatively, openings or lateral cross-sections in vias or pathways that are intentionally non-circular, with a circularity below 0.8, may be useful for certain applications. Typical sizes of the diameter of an opening in a via or pathway are less than or equal to 50 micrometers, and more preferably less than or equal to 30 micrometers, according to various embodiments. In some cases, smaller internal lateral cross-sectional diameters of vias or pathways are preferred, with via diameter less than or equal to 10 micrometers, according to some embodiments.

In light of the above-discussion, according to some embodiments, a method of facilitating formation of a via in an inorganic substrate, which may be at least part of the processes associated with block 220 in FIG. 6, may include, applying the DSOP to the inorganic substrate 100, the inorganic substrate 100 including a damage track 10 having a first end 10a in a first surface 100a of the inorganic substrate 100 and a second end 10b in a second surface 100b of the inorganic substrate 100. The second surface 100b is on an opposite side of the inorganic substrate 100 than the first surface 100a of the inorganic substrate 100. The DSOP may enlarge at least a first dimension (e.g., a size, diameter, or area of lateral cross-section) of the first end 10a of the damage track 10 to form a first opening (e.g., first opening 20a2) in the first surface 100a of the inorganic substrate 100. The first dimension of the first end 10a of the damage track 10 may be measured within a plane (e.g., plane 102a) of the first surface 100a of the inorganic substrate 100. The DSOP may enlarge at least a first dimension (e.g., a size, diameter, or area of lateral cross-section) of the second end 10b of the damage track 10 to form a first opening (e.g., first opening 20b2) in the second surface 100b of the inorganic substrate 100. The first dimension of the second end 10b of the damage track 10 may be measured within a plane (e.g., plane 102b) of the second surface 100b of the inorganic substrate 100. The DSOP produces a via or pathway 30 extending between the first opening (e.g., first opening 20a2) in the first surface 100a of the inorganic substrate 100 and the first opening (e.g., first opening 20b2) in the second surface 100b of the inorganic substrate 100. The via or pathway 30 may include a longitudinal axis 32 perpendicular to (a) an extension direction (e.g., extension direction 104a) of the first surface 100a of the inorganic substrate 100, (b) an extension direction (e.g., extension direction 104b) of the second surface 100b of the inorganic substrate 100, or both (a) and (b). The via or pathway 30 may include varying diameters of lateral cross-sections (e.g., cross-sections 31) taken perpendicular to the longitudinal axis 32 of the via or pathway 30, according to some embodiments. In some embodiments, the pathway includes a waist coinciding with a lateral cross-section of the via or pathway 30 taken perpendicular to the longitudinal axis 32 at a point of minimum diameter of the varying diameters of the pathway According to various embodiments, the DSOP may be any process that etches or removes portions of the inorganic substrate 100 preferentially in the location of the damage track 10 from both sides of the inorganic substrate 100 so as to enlarge the damage track 10 to form a partial or fully formed via (e.g., akin to FIGS. 7B, 7D, and 7E, depending on desired via shaping, according to some embodiments). The DSOP may include etching with reactive gases in a configuration that gives access to both surfaces 100a, 100b, and immersive wet processes involving acidic or basic solutions. Immersive wet processes may be preferred in various contexts. An immersive double-sided opening process performed in a tank may be particularly suitable in various contexts. The immersive wet process may also include agitation of the solution in the tank. Agitation may include fluid flow, application of ultrasonic energy in the range of 30 kHz to approximately 1 MHz, or application of so called megasonic mixing involving the application of frequencies near and above 1 MHz. Etching may be accomplished with solutions of hydroxides, including but not limited to potassium hydroxide, sodium hydroxide, and tetramethylammonium hydroxide at temperatures above 50° C., preferably above 75° C. For many materials, including $SiO_2$-containing materials, solutions containing hydrogen fluoride (HF) may be preferable. Solution compositions including HF at concentrations from 0.1 to 10M may be preferable, and may include additional components to lower or raise pH. The additional components may include, but are not limited to, hydrochloric acid, nitric acid, and ammonium fluoride, according to various embodiments. Additional components may include surfactants. Temperature of the tank may be as cold as −10° C. or up to 60° C., with a range between 0° C. and 50° C. being preferable in some contexts.

Multicomponent glasses such as borosilicate or aluminoborosilicate glass contain components such as calcium and magnesium that tend to precipitate upon etching with HF. This precipitation may lead to non-uniform etch and fouling of the etching vessels. Certain etchant formulations prevent significant precipitation, generally by providing lower hydrofluoric concentration and higher concentrations of a strong acid. A strong acid may be any acid with an acid dissociation constant, pKa, of less than 2, preferably less than 1 in some contexts, including but not limited to hydrochloric, nitric, or sulfuric acid. Preferred etching solutions may contain an HF concentration less than between 0.1 and 1M and a strong acid concentration greater than 0.8M and less than 10M, preferably less than 5M in some contexts. Particularly preferred etching compositions may contain an HF concentration below 0.6M and a strong acid concentration above 1M.

As the DSOP continues beyond the state of FIG. 7B, the depth of the opening on each side of the damage track 10 moves closer to the center of the inorganic substrate 100 along damage track 10. Referring to FIGS. 7D to 7F, as the double-sided opening process continues, the opening regions eventually connect, causing the via or pathway 30 to include an open channel extending all the way through the inorganic substrate 100. In each of at least FIGS. 7B, 7D, and 7E, the via or pathway extends from the first opening (e.g., opening 106a, opening 106a1, or opening 106a2) in the first surface 100a of the inorganic substrate 100 to or at least toward the first opening (e.g., opening 106b, opening 106b1, or opening 106b2) in the second surface 100b of the inorganic substrate 100, the via or pathway (e.g., via or pathway 30) including a longitudinal axis 32 (e.g., FIG. 7F), e.g., perpendicular to an extension direction (e.g., at least extension direction 104a) of the first surface 100a of the inorganic substrate 100 and, e.g., perpendicular to an extension direction (e.g., at least extension direction 104b) of the second surface 100b of the inorganic substrate 100, according to some embodiments.

According to some embodiments, the DSOP yields a diameter (e.g., diameter 20a in FIG. 7B, diameter 20a1 in FIG. 7D, or diameter 20a2 in FIG. 7F) of the first opening (e.g., first opening 106a in FIG. 7B, first opening 106a1 in FIG. 7D, or first opening 106a2 in FIG. 7E) in the first surface 100a of the inorganic substrate 100 and a diameter (e.g., diameter 20b in FIG. 7B, first diameter 20b1 in FIG. 7D, or first diameter 20b2 in FIG. 7E) of the first opening (e.g., first opening 106b in FIG. 7B, first opening 106b1 in FIG. 7D, or first opening 106b2 in FIG. 7E) in the second surface 100b of the inorganic substrate 100. The above diameters may be of the same or similar dimensions since etching of both surfaces 100a and 100b may occur in the same process, according to some embodiments. Slight variations in conditions may exist on either side of the inorganic substrate 100 leading to slightly different diameters of the openings on the first surface 100a and the second surface 100b, and, therefore, a ratio of the two diameters may be considered. In this regard, in some embodiments, a ratio of (a) a diameter (e.g., diameter 20a in FIG. 7B, diameter 20a1 in FIG. 7D, or diameter 20a2 in FIG. 7E) of the first opening (e.g., first opening 106a in FIG. 7B, first opening 106a1 in FIG. 7D, or first opening 106a2 in FIG. 7E) in the first surface 100a of the inorganic substrate 100 to (b) a diameter (e.g., diameter 20b in FIG. 7B, diameter 20b1 in FIG. 7D, or diameter 20b2 in FIG. 7F) of the first opening (e.g., first opening 106b in FIG. 7B, first opening 106b1 in FIG. 7D, or first opening 106b2 in FIG. 7D) in the second surface 100b of the inorganic substrate 100 is between 0.7 and 1.3, in some embodiments, and between 0.8 and 1.2 in some embodiments, the diameter of the opening in the first surface 100a of the inorganic substrate 100 and the diameter of the first opening in the second surface 100b of the inorganic substrate 100 being measured along parallel line segments, according to some embodiments.

With respect to FIG. 6, and in view of the above discussion of various embodiments of the DSOP, which may be included as at least part of block 220 in FIG. 6, a DSOP may be applied to a first inorganic substrate (e.g., inorganic substrate 100) prior to forming a wafer stack (e.g., according to block 222 in FIG. 6, discussed in more detail below). The first inorganic substrate (e.g., inorganic substrate 100) may include a damage track (e.g., damage track 10) prior to applying the DSOP, and the DSOP may form a via (e.g., via 30) through the first inorganic substrate from the damage track, according to some embodiments. An abrasive process may be applied (e.g., according to block 224 in FIG. 6, discussed in more detail below) to at least part of the wafer stack to reduce a length of the via, according to some embodiments. In some embodiments, the via (e.g., via 30) has an hourglass shape immediately upon conclusion of the DSOP, and the via may have a conical shape immediately upon conclusion of the abrasive process (e.g., as discussed in more detail below at least with respect to FIG. 8C and FIG. 8D).

Figure 8A:
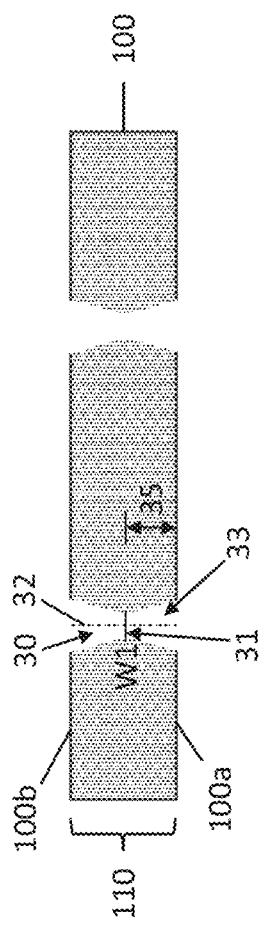

FIG. 8A illustrates a first inorganic substrate 100 that has vias formed therein (only one via 30 called out in FIG. 8A for purposes of clarity). The vias (e.g., via 30) may exhibit an hourglass shape 33, having a waist of diameter W1 taken at a lateral cross section 31 along the longitudinal axis 32 of the via 30, according to the state of FIG. 7D for purposes of illustration only. Via 30 may be produced by any suitable process, including the DSOP discussed above, or any other process producing a via with a waist, according to some embodiments. In this regard, in some embodiments, the obtaining the first inorganic wafer (e.g., first inorganic wafer 100) according to block 220 in FIG. 6 may include applying a DSOP to the first inorganic wafer, the first inorganic wafer including a damage track (e.g., damage track 10) prior to applying the DSOP, and the DSOP forming the via (e.g., via 30) through the first inorganic wafer from the damage track, according to some embodiments. As shown in FIG. 8A, the waist W1 of the via 30 is located at a distance 35 from the first surface 100a of the inorganic substrate 100. The via 30 may be nearly symmetric indicating that distance 35 from the first surface 100a to the waist location may be approximately 0.5 times the substrate thickness 110, or, in some embodiments, from 0.4 to 0.6 times the substrate thickness 110. Other vias in the inorganic substrate 100 may have the same or similar characteristics as the via 30, according to some embodiments.

Figure 8B:
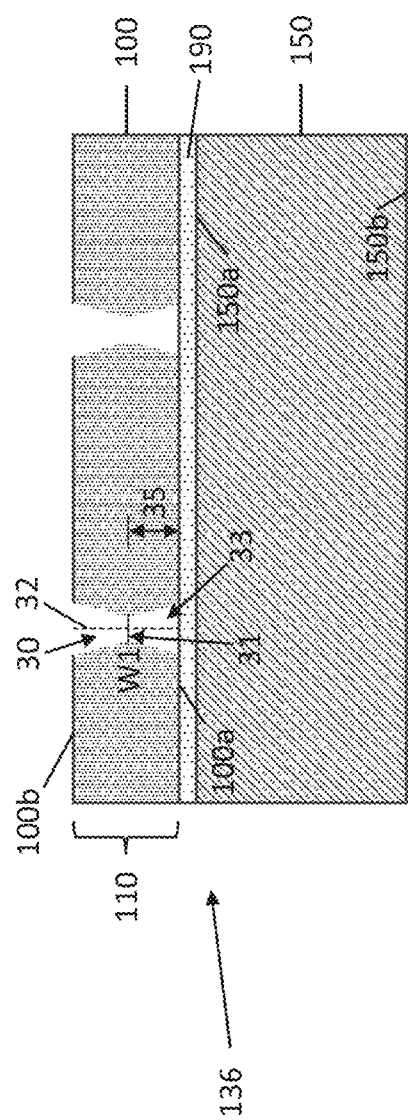

Referring to FIG. 8B, the inorganic substrate 100 may be bonded, e.g., according to processes associated with block 222 in FIG. 6, to handle substrate or wafer 150, such that the first surface 100a of the inorganic substrate 100 and the first surface 150a of the handle substrate or wafer 150 are in contact by way of an adhesion layer 190. The bonding associated with block 222 may form a wafer stack, such as wafer stack 136 shown in FIG. 8B. The adhesion layer 190 may be the same as or correspond to the adhesion layer 180 previously discussed, according to some embodiments. In some embodiments, the adhesion layer 190 may be of any form including temporary bonding. In some embodiments, forming a wafer stack according to block 222 may include performing a temporary bonding process to temporarily bond at least a first surface (e.g., first surface 100a) of the first inorganic wafer (e.g., first inorganic wafer 100) to a first surface (e.g., first surface 150a) of the handle wafer (e.g., handle wafer 150), the handle wafer itself including at least one inorganic wafer, according to some embodiments.

Such temporary bonding may include, but not be limited to, modification layers, carbonaceous modification layers as discussed above, and polymeric adhesives. For the case of carbonaceous modification layers, such layers may have a thickness between 1 nm and 500 nm, according to some embodiments. In some embodiments, the adhesion layer 190 may include a vacuum deposited carbonaceous film with a thickness between 1 nm and 100 nm, inclusive. The vacuum deposited carbonaceous layer thickness may preferably be between 2 nm and 50 nm, inclusive, in some embodiments. Polymeric adhesives may include any of so-called wafer bonding adhesives, including products in the series of BrewerBOND temporary bonding products produced by Brewer Science, Inc. BrewerBOND is a registered Trademark of Brewer Science, Inc., of 2401 Rolla Drive, Rolla MISSOURI, 65401 USA. Such layers may have a thickness above 5 micrometers. Polymeric adhesives for temporary bonding between a substrate and a handle include, but are not limited to, ones that are spun-on as a fluid, or laminated as dry films. Some systems include spinning onto the substrate or onto the handle, or spinning one component onto the substrate and spinning another component onto the handle before bonding. The materials can include thermoplastic materials, acrylics, polyimides, silicone elastomers, and additional curable adhesive materials. The bonding can take place under vacuum, and can take place under pressure. The release for the temporary bonding polymeric adhesives can be by UV exposure including by laser, by mechanical debond, by thermal release including by thermal slide, or by wet chemistry. Choice of which adhesive to use can be influenced by the inorganic substrate material, the handle type, the preferred bonding condition, the process conditions including elevated temperature steps that the bonded pair will be subjected to, the preferred debonding conditions, and by the cleaning steps required to remove residue after the temporary bond is released. In some embodiments, a temporary bonding process associated with block 222 in FIG. 6 may include formation of a solution deposited polymeric film acting as adhesion layer 190 between the first surface 100a of the first inorganic wafer 100 and the first surface 150a of the handle wafer 150, the polymeric film having a resultant thickness greater than 5 micrometers, according to some embodiments.

The methods of FIG. 6 may include, as illustrated by block 224, applying an abrasive process to at least part of the wafer stack (e.g., wafer stack 136), the abrasive process reducing a thickness (e.g., thickness 110 in FIG. 8B compared to thickness 110 in FIG. 8C) of the first inorganic wafer (e.g., first inorganic wafer 100) to a point that the waist of the via (e.g., resultant via 30a in FIG. 8C) is located at a second surface (e.g., the second surface 100b shown in FIG. 8C) of the first inorganic wafer or has been removed, the second surface of the first inorganic wafer on an opposite side of the first inorganic wafer than the first surface of the first inorganic wafer, and the second surface of the first inorganic wafer existing upon conclusion of the abrasive process, according to some embodiments, as shown, e.g., in FIG. 8C.

In this regard, referring to FIG. 8C, an abrasion process as described above may be applied to the substrate stack (e.g., wafer stack 136) in order to reduce at least the thickness 110 of the first inorganic substrate 100 such that the resulting thickness (e.g., thickness 110 in FIG. 8C) of the first inorganic substrate 100 is less than or equal to the original distance 35 from the first surface 100a to the original waist W1. In other terms, an abrasion process may be applied to the wafer stack 136 in order to reduce at least the thickness of inorganic substrate 100 such that the waist of the resulting via 30a (which resulted by grinding down the first inorganic substrate 100 to reduce a length of the via 30) is located now at the second surface 100b existing upon the conclusion of the abrasive process of the first inorganic substrate 100, or such that the waist of the via 30 has been removed or substantially removed. It can be understood that substantially removed can mean that if a waist is still present after the grinding process, that waist is at a position that is at least 90% of the distance from the first surface 100a of the first inorganic substrate 100 to the second surface 100b of the first inorganic substrate 100 existing upon completion of the abrasive process associated with block 224, according to some embodiments.

Figure 8D:
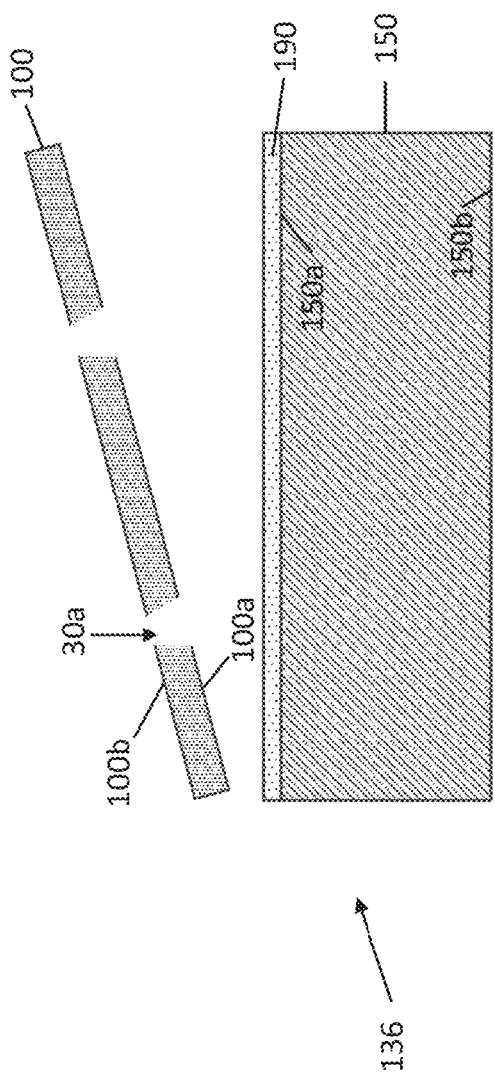

Referring to FIG. 8D, the thinned inorganic substrate 100 may be debonded from the handle wafer 150 to yield a freestanding wafer 100 with vias, which may be available for use in one or more downstream applications. The resultant via or pathway 30a may be funnel-shaped, trumpet-shaped, megaphone-shaped, frustum-shaped, or conical frustum-shaped. As compared to the conventional via formed according to the descriptions of FIGS. 12A-12C, the resulting improved vias 30a shown, for example, at least in FIG. 8C, have no or reduced undercutting.

Similar to the discussions above with respect to FIGS. 3A-3C, FIGS. 9A, 9B, and 9C illustrate that some embodiments of the methods of FIG. 6 may be performed with two inorganic substrates or wafers bonded to a single handle wafer, handle substrate, or handle stack. With respect to FIG. 9A, the first inorganic substrate or wafer 100 (including a via 30-1 in this example) and the second inorganic substrate or wafer 120 (including a via 30-2 in this example) are bonded to the handle substrate 150. Such bonding may be temporary as discussed above. The adhesion layer 190 may be considered a first adhesion layer 190 and may be located between the first surface 100a of the first inorganic substrate 100 and the first surface 150a of the handle substrate 150. A second adhesion layer 192, which may have the same or similar properties and application techniques as adhesion layer 190 as discussed above, may be located between the first surface 120b of the second inorganic substrate 120 and the second surface (150b) of the handle substrate. The resulting structure yields a wafer or substrate stack 137 according to the processes associated with block 222 in FIG. 6.

Referring to FIG. 9B and block 224 in FIG. 6, the wafer stack 137 may be subjected to an abrasive process. The abrasive process may be applied to at least the second surface 100b of the first inorganic wafer or substrate 100 and simultaneously applied to at least the second surface 120b of the second inorganic wafer substrate 120, using for example any of the processes discussed above in this context, such as, but not limited to, DSLP, according to some embodiments. The abrasive process may be applied to the wafer or substrate stack 137 in order to reduce at least the thickness 110 of the first inorganic wafer or substrate 100 and at least the thickness 112 of the second inorganic wafer or substrate 120, e.g., such that the resulting thickness (e.g., thickness 110 in FIG. 9B) of the first inorganic wafer or substrate 100 is less than or equal to the original distance 35 (e.g., FIG. 8B, but applied to this context) from the first surface 100a to the original waist W1 (e.g., FIG. 8B, but applied to this context), and the resulting thickness (e.g., thickness 110 in FIG. 9B) of the second inorganic wafer or substrate 120 is less than or equal to the corresponding original distance (i.e., corresponding to original distance 35, but applied to the via 30-2) from the first surface 120a to the original waist of the via 30-2. In other terms, an abrasion process may be applied to the wafer or substrate stack 137 in order to reduce at least the thickness 110 of the first inorganic substrate 100 such that the waist of the via 30-1 is located now at the second surface 100b existing upon the conclusion of the abrasive process of substrate 100, or such that the waist of the via 30-1 has been removed or substantially removed, and to reduce at least the thickness 112 of the second inorganic substrate 120 such that the waist of the via 30-2 is located now at the second surface 120b existing upon the conclusion of the abrasive process of substrate 120, or that the waist of the via 30-2 has been substantially removed. It can be understood that substantially removed can mean that if a waist is still present after the grinding process, that waist is at a position that is 90% of the distance from the first surface (100a or 120a) to the second surface (100b or 120b) of the inorganic wafer existing upon completion of the abrasive process. The abrasive process associated with block 224 results in the formation of resultant tapered vias 30a-1, 30a-2 shown in FIG. 9B, and the characteristics of such vias are those as described above with respect to at least FIG. 8C and FIG. 8D, according to some embodiments.

Figure 9A:
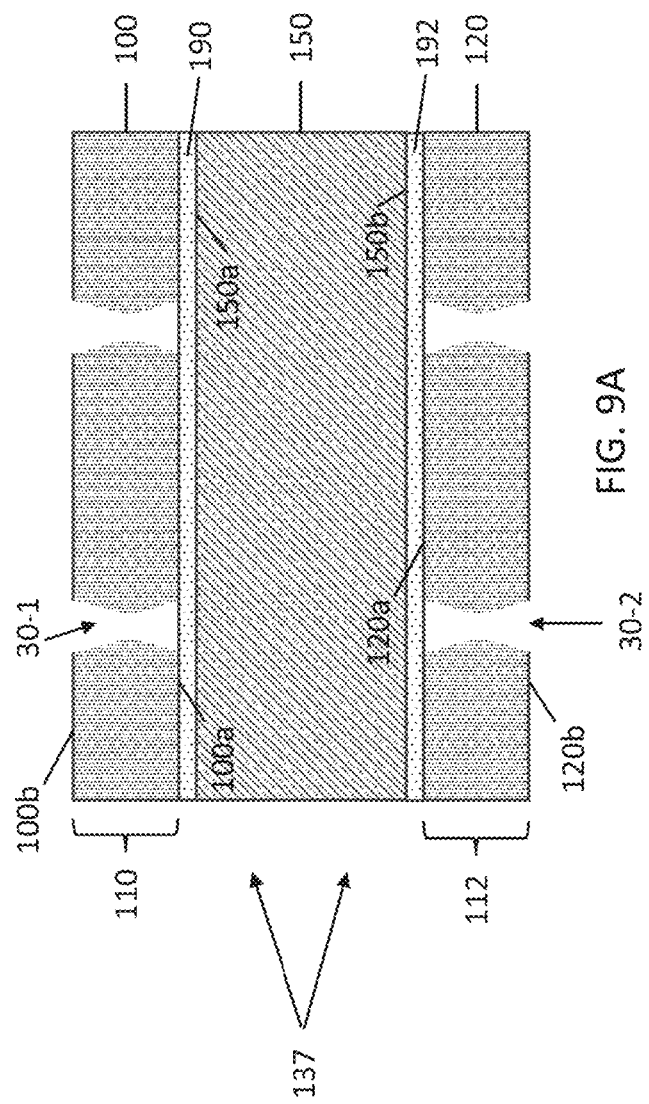
Figure 9C:
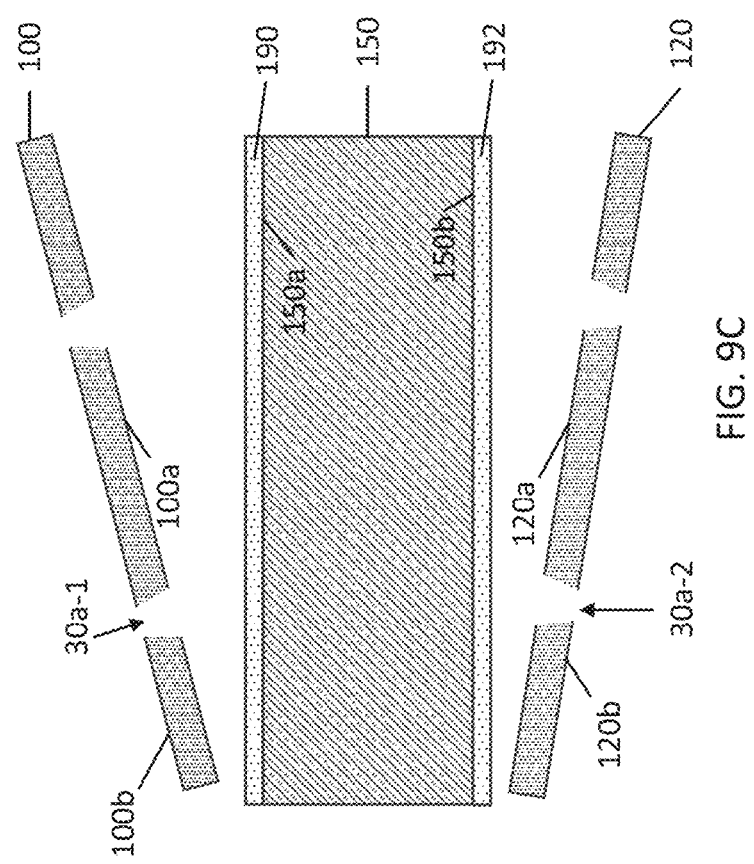

In accordance with the processes associated with block 226, the thinned wafers 100, 120 shown in FIG. 9B may be debonded, as shown by FIG. 9C, by methods including those discussed above, according to some embodiments.

Figure 10:
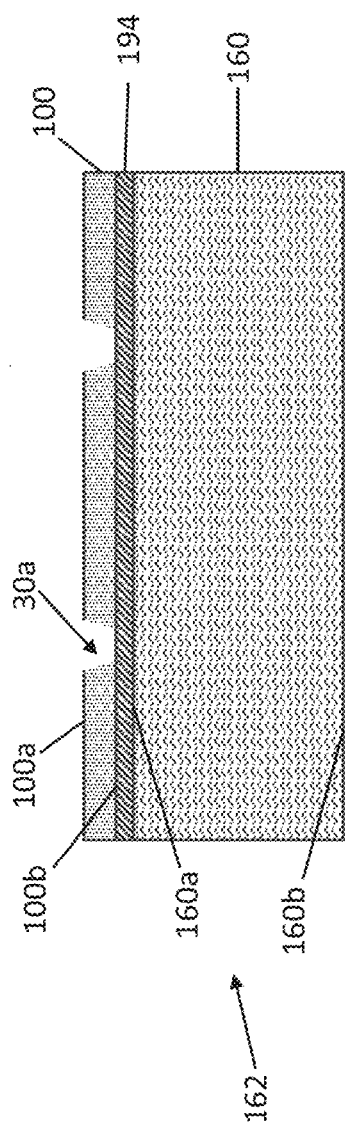
FIG. 10 illustrates a rebonding of a thinned inorganic substrate, including a conical or approximately conical via, to a second handle wafer with the via having its largest diameter exposed subsequent to the rebonding, according to some embodiments of the present invention.

Referring to FIG. 10, in some embodiments of the present invention, a thinned via containing substrate (e.g., thinned first inorganic substrate 100 from FIG. 9C, thinned second inorganic substrate 120 from FIG. 9C, or both) that contains a via or pathway that may be funnel-shaped, trumpet-shaped, megaphone-shaped, frustum-shaped, or conical frustum-shaped, and that has been debonded from a first handle wafer or substrate (e.g., handle wafer or substrate 150), may be bonded to a second handle wafer or substrate (e.g., second handle wafer or substrate 160) with any suitable adhesion layer 194. The second handle wafer or substrate 160 may include a first surface 160a and a second surface 160b on an opposite side of the second handle wafer or substrate 160 than the first surface 160a. In this regard, in some embodiments, after applying the abrasive process associated with block 224, a second wafer stack 162 may be formed at least by performing a second bonding process including bonding, e.g., the first inorganic wafer 100 to the first surface 160a of the second handle wafer 160. In some embodiments, the second surface 100b of the first inorganic substrate 100, containing a smaller via diameter opening, may be closest in bonding to the first surface 160a of the second handle wafer or substrate 160. The result is a via with a conical shape with a wider opening on the new exposed surface 100a than at the bottom of the via, which may be a preferred shape for vacuum coating, deposition, or electroplating. In some embodiments, the first surface 100a of the first inorganic substrate 100, containing the larger via diameter opening, may be closest in bonding to the first surface 160a of the second handle wafer or substrate 160, which may be preferable in some contexts. In various embodiments, the forming of the second wafer stack 162 shown in FIG. 10 may occur before or after debonding, e.g., the first inorganic wafer 100 from the first handle wafer 150.

Figure 11A:
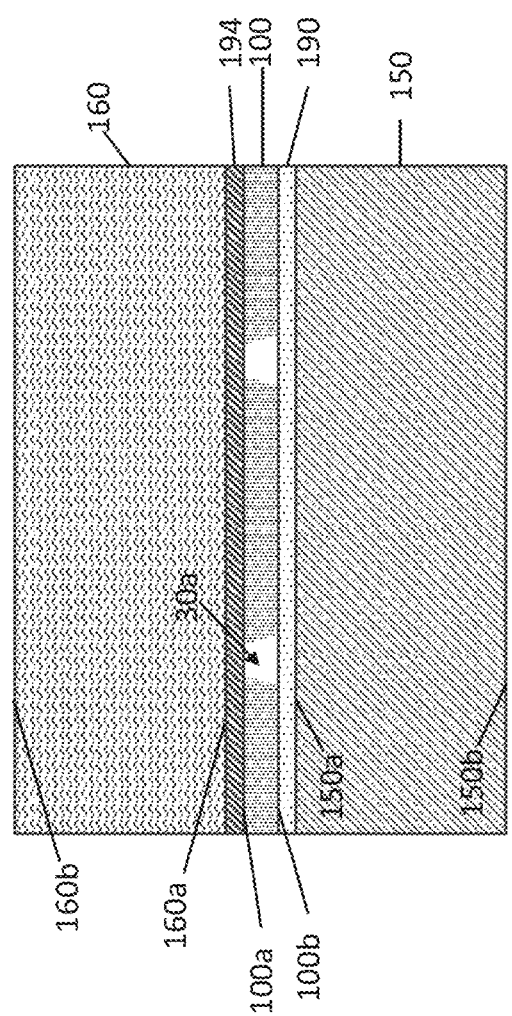
FIGS. 11A and 11B illustrate the transfer of a thinned inorganic substrate, including a conical or approximately conical via, to a second handle wafer so that, upon debond, the via has its largest diameter exposed and is attached to the second handle wafer, according to some embodiments of the present invention.
Figure 11B:
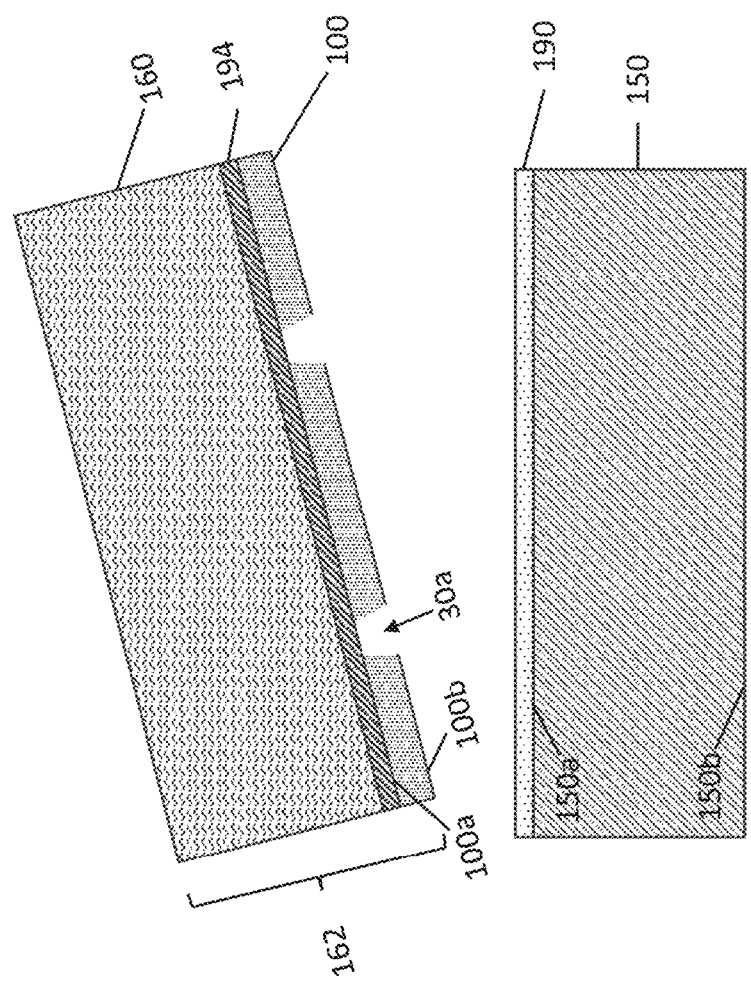

In this regard, referring to FIG. 11A, in some embodiments, a thinned via containing substrate (e.g., thinned first inorganic substrate 100 from FIG. 9C, thinned second inorganic substrate 120 from FIG. 9C, or both) still bonded to first handle wafer or substrate 150 can be bonded with any suitable adhesion layer 194 to a second handle wafer or substrate 160. Referring to FIG. 11B, the wafer stack 162 can be debonded by initiating a debond in the location of adhesion layer 190 to produce a desired stack 162 in one step while never having thin substrate 100 in a freestanding thus fragile form.

Subsets or combinations of various embodiments described above provide further embodiments. For example, although the term "wafer" commonly is used herein to describe a type of inorganic substrate or handle substrate, other embodiments use other forms of substrates besides wafers, such as panels and other forms of substrates. Accordingly, the present invention is not limited to use of wafers or a particular type of substrate. These and other changes can be made to the invention in light of the above-detailed description and still fall within the scope of the present invention. In general, in the following claims, the terms used should not be construed to limit the invention to the specific embodiments disclosed in the specification. Accordingly, the invention is not limited by the disclosure, but instead its scope is to be determined entirely by the following claims.

What is claimed is:

1. A method of processing an inorganic wafer, the method comprising:
    forming a wafer stack at least by performing a temporary bonding process to temporarily bond at least a first inorganic wafer to a first surface of a handle wafer and to temporarily bond at least a second inorganic wafer to a second surface of the handle wafer, the second surface of the handle wafer on an opposite side of the handle wafer from the first surface of the handle wafer, the handle wafer comprising at least one inorganic wafer, the temporary bonding process including formation of a first adhesion layer between the first inorganic wafer and the first surface of the handle wafer and formation of a second adhesion layer between the second inorganic wafer and the second surface of the handle wafer, each of the first adhesion layer and the second adhesion layer comprising a vacuum deposited carbonaceous film with a thickness between 1 nm and 100 nm, inclusive, and comprising a total thickness variation of less than 0.1 microns;
    applying a double-sided lapping and polishing process simultaneously to the first inorganic wafer and the second inorganic wafer of the wafer stack to reduce a thickness of each of the first inorganic wafer and the second inorganic wafer of the wafer stack; and
    debonding the first inorganic wafer and the second inorganic wafer from the handle wafer after the applying the double-sided lapping and polishing process.

2. The method of claim 1, wherein at least the first adhesion layer provides a bond energy between 200 mJ/m$^2$ and 1,200 mJ/m$^2$, inclusive.

3. The method of claim 1, wherein a diameter of the handle wafer exceeds a diameter of each of the first inorganic wafer and the second inorganic wafer by at least 1 mm.

4. The method of claim 1, wherein a diameter of the handle wafer is equal to a diameter of each of the first inorganic wafer and the second inorganic wafer.

5. The method of claim 1, wherein, prior to applying the double-sided lapping and polishing process, a thickness of each of the first inorganic wafer and the second inorganic wafer of the wafer stack is between 300 micrometers and 1 mm, inclusive, and, upon completion of applying the double-sided lapping and polishing process, a thickness of each of the first inorganic wafer and the second inorganic wafer of the wafer stack is between 200 micrometers and 10 micrometers, inclusive.

6. The method of claim 1, wherein the handle wafer comprises multiple inorganic wafers bonded to each other, either temporarily bonded or permanently bonded.

7. The method of claim 1, wherein the handle wafer has a thickness in a range of 0.3 mm to 10 mm.

8. The method of claim 1, wherein a diameter of the handle wafer exceeds a diameter of the first inorganic wafer by at least 1 mm.

9. The method of claim 1, wherein a diameter of the handle wafer is equal to a diameter of the first inorganic wafer.

10. The method of claim 1, wherein the handle wafer comprises an inorganic wafer made of silicon, fused silica, borosilicate glass, or boro-aluminosilicate glass.

11. The method of claim 1, wherein, prior to applying the double-sided lapping and polishing process, a thickness of the first inorganic wafer of the wafer stack is between 300 micrometers and 1 mm, inclusive, and, upon completion of applying the double-sided lapping and polishing process, a thickness of the first inorganic wafer of the wafer stack is between 200 micrometers and 10 micrometers, inclusive.

12. The method of claim 1, comprising applying a double-sided opening process to the first inorganic wafer prior to forming the wafer stack, the first inorganic wafer comprising a damage track prior to applying the double-sided opening process, the double-sided opening process forming a via through the first inorganic wafer from the damage track,
wherein the double-sided lapping and polishing process reduces a length of the via.

13. The method of claim 12, wherein the via has an hourglass shape immediately upon conclusion of the double-sided opening process, and the via has a conical shape immediately upon conclusion of the double-sided lapping and polishing process.

14. A method of forming a tapered via in an inorganic wafer, the method comprising:
obtaining a first inorganic wafer that includes a via through the first inorganic wafer, the via comprising a waist;
forming a wafer stack at least by performing a first bonding process to temporarily bond at least a first surface of the first inorganic wafer to a first surface of a handle wafer, the handle wafer itself comprising at least one inorganic wafer;
applying an abrasive process to at least part of the wafer stack, the abrasive process reducing a thickness of the first inorganic wafer to a point that the waist of the via is located at a second surface of the first inorganic wafer or has been removed, the second surface of the first inorganic wafer on an opposite side of the first inorganic wafer from the first surface of the first inorganic wafer, and the second surface of the first inorganic wafer existing upon conclusion of the abrasive process; and
debonding the first inorganic wafer from the handle wafer after the applying the abrasive process.

15. The method of claim 14, wherein the obtaining the first inorganic wafer includes applying a double-sided opening process to the first inorganic wafer, the first inorganic wafer comprising a damage track prior to applying the double-sided opening process, the double-sided opening process forming the via through the first inorganic wafer from the damage track.

16. The method of claim 14, wherein the first bonding process includes formation of an adhesion layer between the first surface of the first inorganic wafer and the first surface of the handle wafer, the adhesion layer comprising a vacuum deposited carbonaceous film with a thickness between 1 nm and 100 nm, inclusive.

17. The method of claim 14, wherein the first bonding process includes formation of a solution deposited polymeric film between the first surface of the first inorganic wafer and the first surface of the handle wafer, the solution deposited polymeric film having a resultant thickness greater than 5 micrometers.

18. The method of claim 14,
wherein the handle wafer includes a second surface on an opposite side of the handle wafer from the first surface of the handle wafer,
wherein the forming of the wafer stack includes performing the first bonding process to temporarily bond at least the first surface of the first inorganic wafer to the first surface of the handle wafer, and a first surface of a second inorganic wafer to the second surface of the handle wafer,
wherein the abrasive process reduces a thickness of the first inorganic wafer of the wafer stack and reduces a thickness of the second inorganic wafer of the wafer stack, and
wherein the debonding includes debonding the first inorganic wafer and the second inorganic wafer from the handle wafer.

19. The method of claim 14,
wherein the handle wafer is a first handle wafer, and
wherein, after the abrasive process, the method comprises forming a second wafer stack at least by performing a second bonding process including bonding the second surface of the first inorganic wafer to a first surface of a second handle wafer.

20. The method of claim 19, wherein the forming of the second wafer stack occurs before debonding the first inorganic wafer from the first handle wafer.

21. The method of claim 19, wherein the forming of the second wafer stack occurs after debonding the first inorganic wafer from the first handle wafer.

* * * * *